(12) United States Patent
Ta et al.

(10) Patent No.: US 11,002,598 B2
(45) Date of Patent: May 11, 2021

(54) ELECTRONIC APPARATUS AND MEASURING METHOD OF DETECTING PULSES DEPENDING ON PHOTONS COMPRISING DUAL WAVEFORM SHAPING CIRCUITS

(71) Applicant: KABUSHIKI KAISHA TOSHIBA, Tokyo (JP)

(72) Inventors: Tuan Thanh Ta, Kawasaki Kanagawa (JP); Akihide Sai, Yokohama Kanagawa (JP); Hidenori Okuni, Yokohama Kanagawa (JP); Satoshi Kondo, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 114 days.

(21) Appl. No.: 16/292,813

(22) Filed: Mar. 5, 2019

(65) Prior Publication Data

US 2020/0064186 A1 Feb. 27, 2020

(30) Foreign Application Priority Data

Aug. 27, 2018 (JP) .............................. JP2018-158707

(51) Int. Cl.
| | |
|---|---|
| *G01J 1/44* | (2006.01) |
| *G01S 17/10* | (2020.01) |
| *G01S 7/4865* | (2020.01) |
| *G01S 7/4861* | (2020.01) |

(52) U.S. Cl.
CPC .............. *G01J 1/44* (2013.01); *G01S 7/4861* (2013.01); *G01S 7/4865* (2013.01); *G01S 17/10* (2013.01); *G01J 2001/442* (2013.01); *G01J 2001/4466* (2013.01)

(58) Field of Classification Search
CPC ................. H01L 31/107; H01L 27/146; H01L 31/02027; H01L 27/14612; H01L 27/14627; H01L 27/1463; H01L 27/14636; H01L 27/43; G01J 1/44; G01J 2001/4466;

(Continued)

(56) References Cited

U.S. PATENT DOCUMENTS

| 7,897,906 B2 | 3/2011 | Deschamps | |
|---|---|---|---|
| 8,586,908 B2 * | 11/2013 | Eldesouki | ................ G01J 1/44 250/214 R |

FOREIGN PATENT DOCUMENTS

| JP | 2010-521825 A | 6/2010 |
|---|---|---|
| JP | 2012-60012 A | 3/2012 |

* cited by examiner

*Primary Examiner* — Que Tan Le
(74) *Attorney, Agent, or Firm* — Foley & Lardner LLP

(57) ABSTRACT

According to one embodiment, an electronic apparatus includes a first avalanche photo diode, a second avalanche photo diode, a first pulse circuit, a second pulse circuit, a first waveform shaping circuit, a second waveform shaping circuit and an adder. The first pulse circuit is configured to shape a signal of the first avalanche photo diode to a first pulse. The second pulse circuit is configured to shape a signal of the second avalanche photo diode to a second pulse. The first waveform shaping circuit is configured to shape the first pulse to a third pulse having a narrower frequency bandwidth than that of the first pulse. The second waveform shaping circuit is configured to shape the second pulse to a fourth pulse having a narrower frequency bandwidth than that of the second pulse. The adder is configured to add the third pulse and the fourth pulse.

11 Claims, 23 Drawing Sheets

(58) Field of Classification Search
CPC ..... G01J 2001/442; H03K 5/01; H04N 5/379; G01S 17/10; G01S 7/4865
USPC .......................................... 250/214 R, 221
See application file for complete search history.

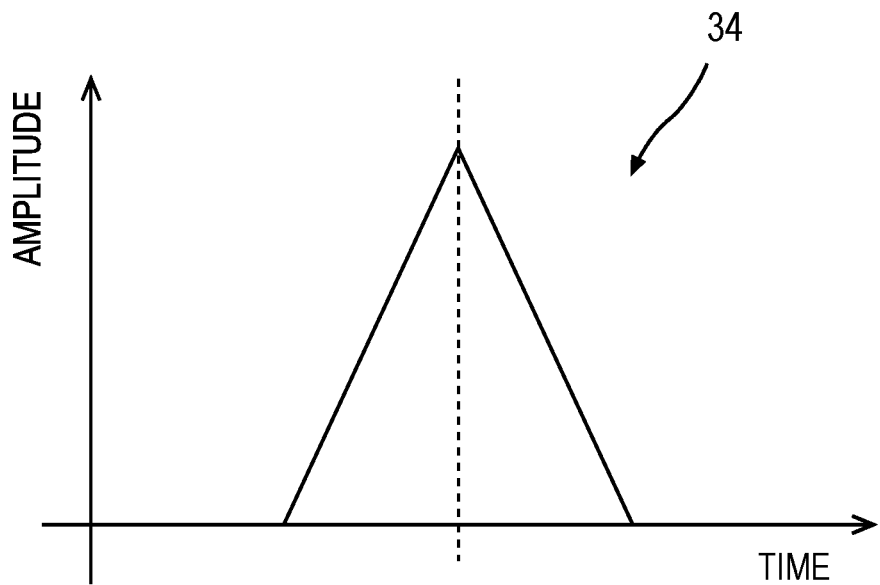
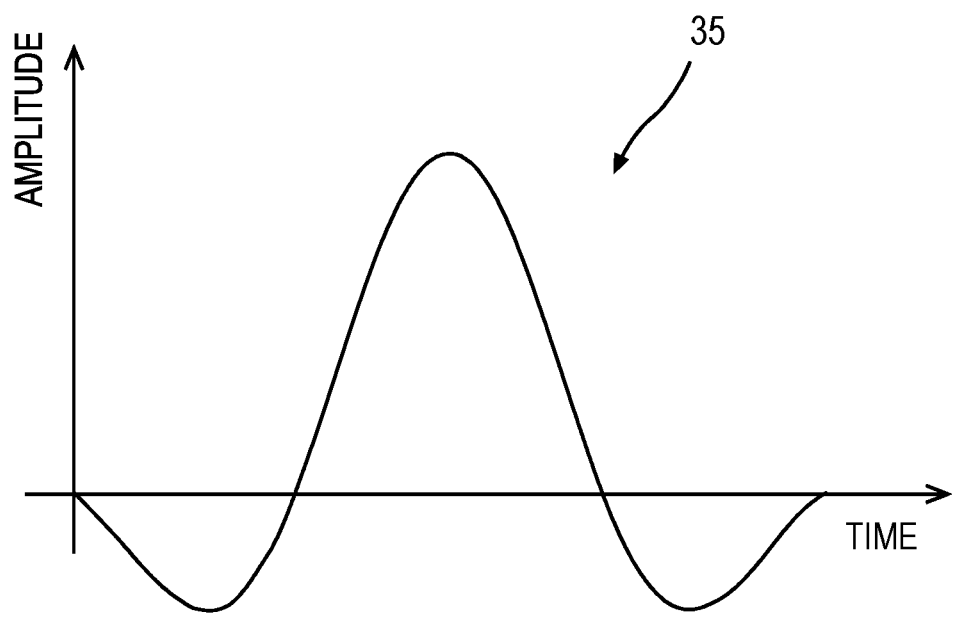
FIG. 6

ELECTRONIC APPARATUS AND MEASURING METHOD OF DETECTING PULSES DEPENDING ON PHOTONS COMPRISING DUAL WAVEFORM SHAPING CIRCUITS

CROSS-REFERENCE TO RELATED APPLICATIONS

This application is based upon and claims the benefit of priority from Japanese Patent Application No. 2018-158707, filed on Aug. 27, 2018; the entire contents of which are hereby incorporated by reference.

FIELD

Embodiments described herein relate generally to an electronic apparatus and a measuring method.

BACKGROUND

It is possible to detect photons with high sensitivity by using avalanche photo diodes (APDs) operating in Geiger mode. However, if various operations including distance measurement are executed using APD arrays, signal processing is required by the circuits in the next stage. For example, signal processing can be used to make photon counting easier. However, the processed signals may include harmonic components.

Since APDs with shorter dead times are available today, the demand for developing high-speed circuits connected to the output terminals of APDs is becoming greater. The development of technology which enables highly accurate distance measurements without the use of expensive high frequency circuits is needed. One example of the high frequency circuits are circuits capable of transmitting and processing signals with wide frequency bandwidths including harmonic components.

BRIEF DESCRIPTION OF THE DRAWINGS

FIG. 6 is a graph showing an example of a pulse in the output signal of a waveform shaping circuit;

DETAILED DESCRIPTION

According to one embodiment, an electronic apparatus includes a first avalanche photo diode, a second avalanche photo diode, a first pulse circuit, a second pulse circuit, a first waveform shaping circuit, a second waveform shaping circuit and an adder. The first pulse circuit is configured to shape a signal of the first avalanche photo diode to a first pulse. The second pulse circuit is configured to shape a signal of the second avalanche photo diode to a second pulse. The first waveform shaping circuit is configured to shape the first pulse to a third pulse having a narrower frequency bandwidth than that of the first pulse. The second waveform shaping circuit is configured to shape the second pulse to a fourth pulse having a narrower frequency bandwidth than that of the second pulse. The adder is configured to add the third pulse and the fourth pulse.

Hereinafter, embodiments of the present invention will be described with reference to the drawings.

First Embodiment

Figure 1:
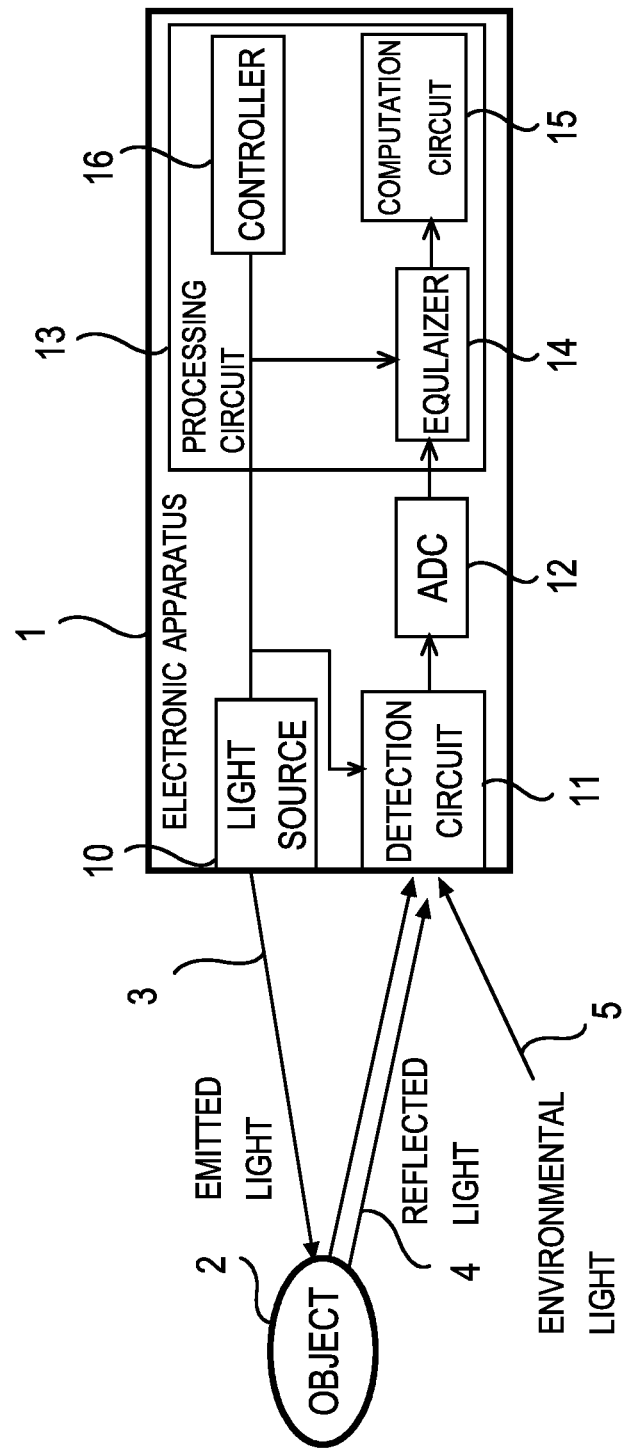
FIG. 1 is a block diagram describing a configuration example of an electronic apparatus according to a first embodiment.

FIG. 1 is a block diagram describing a configuration example of an electronic apparatus according to a first embodiment. An electronic apparatus according to a first embodiment will be described in reference to FIG. 1.

The electronic apparatus 1 in FIG. 1 is a distance measuring device which measures the distance between the device and an object 2. The electronic apparatus 1 includes a light source 10, a detection circuit 11, an A/D converter (ADC) 12 and a processing circuit 13. The processing circuit 13 includes an equalizer 14, a computation circuit 15 and a controller 16 as internal components.

The light source 10 is a device which emits pulses of electromagnetic waves to the object 2. An example of the light source 10 is a combination of laser sources such as laser diodes and circuits which generate pulses (pulse generator circuits). Also, LEDs and various types of lamps can be combined with the pulse generator circuit. Thus, any type of device can be used to generate electromagnetic waves. The frequency bandwidth of the electromagnetic wave generated by the light source 10 is not limited.

The emitted electromagnetic wave may be infrared rays, near infrared rays, visible light, ultraviolet rays or the combination of above. Therefore, the light source 10 can be a source of infrared rays, near infrared rays, visible light or ultraviolet rays. In the following, cases when electromagnetic waves including visible light components are emitted from the light source 10 are explained as examples. Such electromagnetic waves are simply referred to as "light". The pulses of electromagnetic waves emitted from the light source 10 are referred to as the "third pulse". Information of the pulse shape of the light emitted by the light source 10 (pulse shape information) is shared with the detection circuit 11. For example, if light with pulses with approximately rectangular shapes are emitted by the light source 10, the pulse width (for example, 10 ns) is shared with the detection circuit 11 as the pulse shape information. The pulse shape information may be shared by using any method. For example, if the pulse shape of light emitted by the light source 10 is fixed, the pulse shape information can be configured to the detection circuit 11 during the manufacturing of the electronic apparatus 1.

Also, electronic connections or wireless communications between the light source 10 and the detection circuit 11 can be used for referring the pulse shape information. Also, the controller 16 may notify the pulse shape information to the detection circuit 11. Then, if the pulse shape of light emitted by the light source 10 is changed, the detection circuit 11 could obtain information of the new pulse shape. Below, cases when the pulse shapes of the emitted light are approximately rectangular shaped are explained. However, the pulses of emitted light are not limited to specific shapes.

The emitted light 3 generated by the light source 10 is reflected by the object 2. Then, the reflected light 4 enters the detection circuit 11. Part of the emitted light 3 may be absorbed by the object 2. Part of the emitted light 3 may pass through the object 2. The reflected light 4 may be diffused reflection light, specular reflection light or a combination of the above. The reflected light 4 is an example of the reflected wave which is formed by having at least part of the output wave from the light source 10 being reflected by the object 2.

The detection circuit 11 converts the incident light to electric signals. The detection circuit 11 also executes the signal processing for the generated electric signals. The detection circuit 11 includes: an array of elements which executes photoelectric conversion; a waveform shaping circuit which shapes the electric signals provided from each device; and an adder. Examples of elements which execute photoelectric conversion include photodiodes and photomultiplier tubes. However, the type of element is not limited. In the following, the elements which execute photoelectric conversion are avalanche photo diodes (APDs) operating in Geiger mode. Arrays of APDs which operate in Geiger mode include MPPCs (Multi Pixel Photon Counters). However, other elements can be used.

The detection circuit 11 detects electromagnetic waves including the reflected waves of the emitted pulses. The detection circuit 11 also converts the detected electromagnetic waves to first electric signals. The first electric signals which are output signals of the detection circuit 11 can be either analog signals or digital signals. Details of the detection circuit 11 are described later.

Since the incident light may include lights from various sources, the detection circuit 11 may also detect environmental light 5 besides the reflected light 4. The amount and nature of detected environmental light 5 depends on the design of the electronic apparatus 1 and the environment and surface property of the object 2. It is possible that lights from light sources other than the light source 10 (for example other lighting equipment or sunlight) are reflected by the object 2 and detected by the detection circuit 11. Since such light do not originate from the light source 10, they fall into the category of the environmental light 5.

The A/D converter 12 converts the first electric signal from analog signals to digital signals. The type of circuit used for the A/D converter 12 is not limited. If the output signals of detection circuit 11 are digital signals, it is possible to use a sampler circuit instead of the A/D converter 12. If the analog signals are equalized, configurations without the A/D converters or sampler circuits could be used.

In the example of FIG. 1, the A/D converter 12 is connected to the output terminal of the detection circuit 11. However, the circuit connected to the output terminal of the detection circuit 11 could be a different circuit. For example, a digital filter and a sampler circuit could be connected. The digital filter reduces the bandwidth of non-synchronized digital signals. The sampler circuit samples the output signals of the digital filter. The sampler circuit may be configured by using a plurality of flip-flops.

The equalizer 14 equalizes the digital signals provided from the A/D converter 12. For example, the equalizer 14 executes equalization processes including the multiplication of tap coefficients, generating a second electric signal. The configuration of the equalizer 14 and the equalization process applied to the electric signal are not limited. In the example of FIG. 1, the equalization process is applied to the digital signals. However, it is possible to apply the equalization process to the analog signals. If the equalization process is not applied to the electric signals, it is possible to use a configuration without the equalizer.

The equalized signal (second electric signal) provided by the equalizer is entered to the computation circuit 15 connected to the output terminal. The computation circuit 15 estimates the distance between the electronic apparatus 1 and the object 2 based on the equalized signals (second electric signals). For the estimation of distances, it is possible to use the ToF (Time of Flight) method.

ToF is the time required for the emitted light 3 to proceed from the light source 10 to the object 2 and to return back to the electronic device 1 due to reflection by the object 2 (reflected light 4). By multiplying the speed of light (approximately $3 \times 10^8$ m/s) to the time difference ToF and dividing by 2, it is possible to calculate the distance to the object 2. The equation (1) below is the calculated distance.

$$d = \frac{ToF \cdot c}{2} \quad (1)$$

In the equation (1), division by 2 is required to calculate the one-way time instead of the round-trip time.

The controller 16 controls the light source 10 and the detection circuit 11. Specifically, the controller 16 controls the pulse shape, the pulse width, the intensity and the emitted timing of light. Also, the controller 16 may control the frequency of light and the direction of emitted light. The controller 16 is connected electrically to the light source 10. The controller 16 executes the above processes by sending control signals to the light source 10. The control signals may be transmitted by using wireless communication.

Also, the controller 16 is connected electrically to the detection circuit 11. The controller 16 notifies information of the pulse emitted by the light source 10 (pulse information) to the equalizer 14, via the electrical connection. Examples of the notified pulse information include the pulse width $T_{LDPW}$, the waveforms of the emitted light in the time domain, the frequency characteristics $H_{LD}(f)$ of the emitted pulse and the output of emitted light. The output of emitted light may be normalized values, absolute values of electricity and the number of photons. However, the output of emitted light can be measured by using any other method.

The detection circuit 11 can shape the electric signals based on the pulse information which is notified. For example, the detection circuit 11 can configure the pulse width of the electric signal equal to the pulse width $T_{LDPW}$ of light emitted by the light source 10. Thereby, it is possible to maximize the signal-to-noise ratio of the electric signal originating from the reflected light 4, minimizing the effects of noises including the environmental light 5. By executing the above process, the implementation of histogram circuits for inferring the shapes of pulses in the emitted light is no longer required. Details of the waveform shaping processes executed by the detection circuit 11 are described later. The controller 16 may transmit pulse information to the detection circuit 11 by using wireless communication.

The controller 16 may be connected electrically to the equalizer 14. Then, the controller 16 notifies the pulse information of emitted light via the electrical connection. The equalizer 14 may determine the tap coefficients $w_k$ (k=0, 1, . . . , N) based on the notified pulse information. The pulse information may be transmitted by using wireless communication methods.

Figure 2:
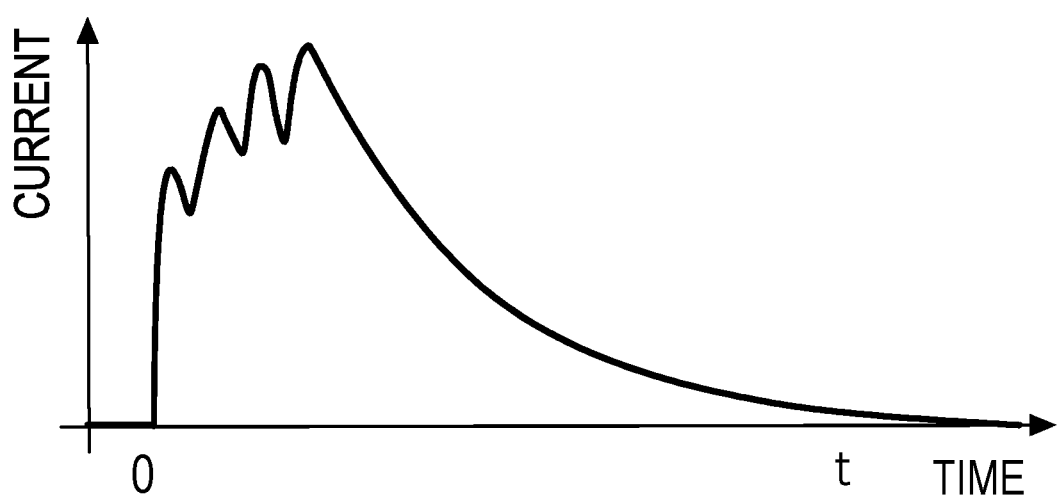
FIG. 2 is a graph of added output signals from a plurality of avalanche photo diodes.

FIG. 2 is a graph of added output signals from a plurality of avalanche photo diodes. In the graph of FIG. 2, the horizontal axis is representing the time. In the graph of FIG. 2, the vertical axis is representing the current of the electric signal. For example, the waveform (pulses) of the electric signals may be obtained by measuring the current, the voltage or the power.

Since the sensitivity of APDs operating in Geiger mode is high, it is possible to detect a single photon. If an APD operating in Geiger mode detects a photon, a transient response occurs. Therefore, if an APD detects a photon, a pulse sloping gently from the peak is in the output signal. Pulses sloping gently from the peak can be expressed approximately by using exponential decay functions with time constant of T.

As presented in the example of FIG. 2, if output signals from a plurality of APDs are added directly, response signals with overlapping pulses of current are generated in the time domain. Since there are usually time differences between the peaks corresponding to each photon, the maximum amplitude of the signal is not equal to total value of the peaks generated in each APD. Therefore, it is difficult to calculate the total number of detected photons by only referring to the wave height (amplitude) of the response signals. The detection circuit according to the embodiment shapes the pulses in the electric signals provided from each APD. Then, it is possible to measure the number of photons originating from the emitted light 3, without using expensive high frequency circuits. Also, it is possible to perform accurate measurements of distances.

Figure 3:
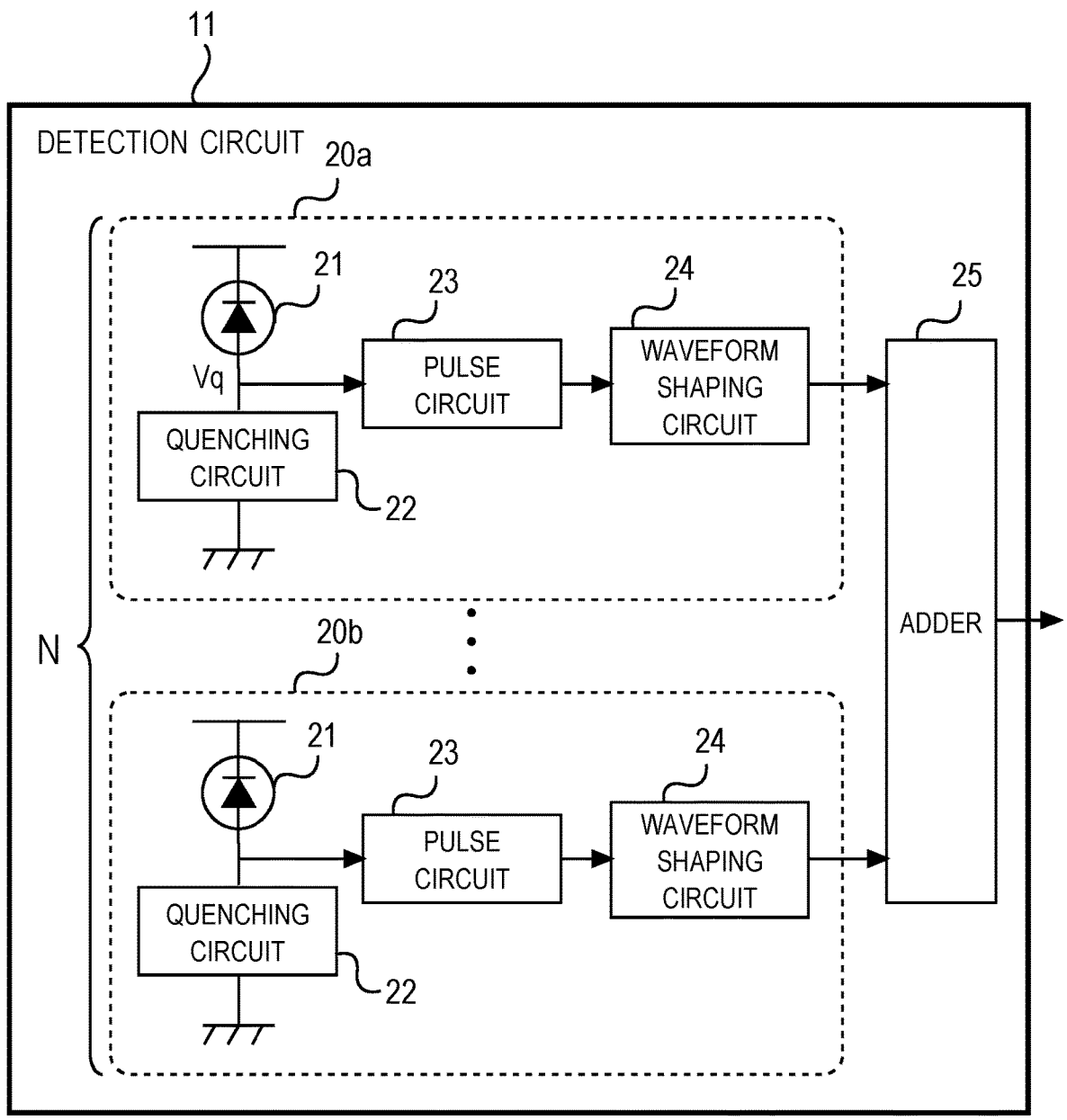
FIG. 3 is a diagram presenting an example of a detection circuit according to the first embodiment.

Next, the configuration of the detection circuit according to the first embodiment is described. FIG. 3 is a diagram presenting an example of a detection circuit according to the first embodiment. In the detection circuit 11, a plurality of branches (for example, N branches including branch 20a and branch 20b) are connected in parallel to the input side of the adder 25. The output signal of the adder 25 becomes the output signal of the whole detection circuit 11. Each of the N branches included in the detection circuit 11 include an APD 21 and a quenching circuit. The output signals of each branch enter the adder 25. The detection circuit 11 operates as a circuit which detects electromagnetic waves (for example, visible light) by using a plurality of avalanche photo diodes.

The configurations for each of the N branches in the circuit are uniform. In the following, the configuration of the branch 20a in the detection circuit 11 is explained as an example.

The branch 20a includes an APD 21, a quenching circuit 22, a pulse circuit 23 and a waveform shaping circuit 24. The APD 21 is an avalanche photo diode operating in Geiger mode. The quenching circuit 22 is connected between the output of APD 21 and the ground. Examples of the ground include the reference potential of the detection circuit 11 and the electronic apparatus 1. The quenching circuit 22 stops the avalanche current by setting the bias voltage of the APD to a value lower than the breakdown voltage. The quenching circuit 22 may include passive elements such as resistors. The quenching circuit 22 may also include active elements such as transistors. The configuration of the quenching circuit 22 is not limited.

Figure 4:
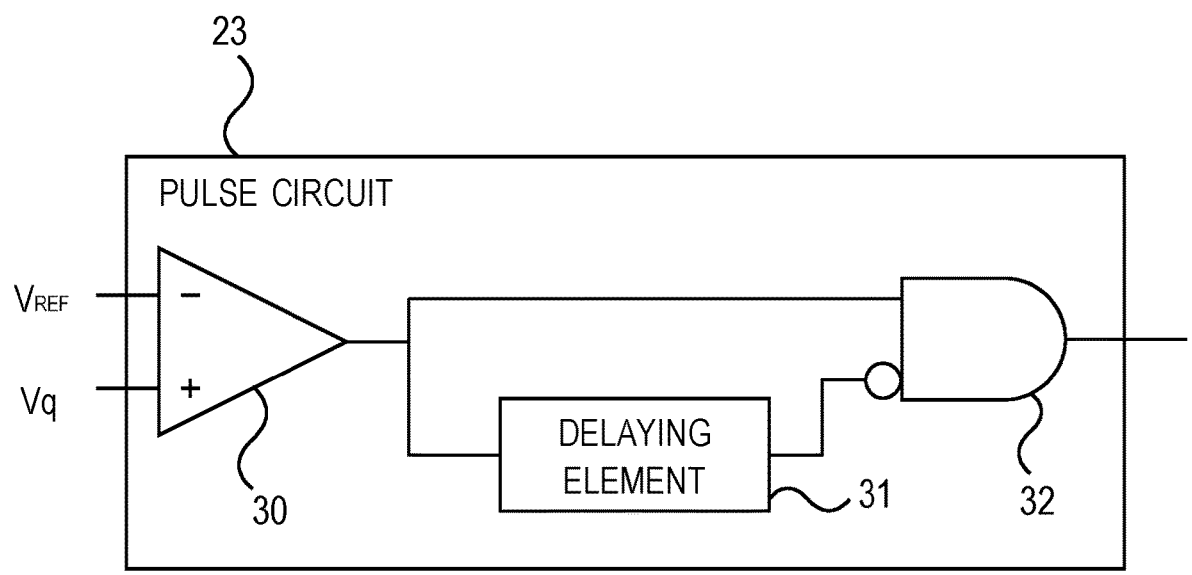
FIG. 4 is a diagram presenting an example of a pulse circuit.

The output terminal of the APD 21 (the input terminal of the quenching circuit 22) is connected to the pulse circuit 23. The pulse circuit 23 shapes the pulses in the output signal of the APD 21 to approximately rectangular shapes. FIG. 4 is a diagram presenting an example of a pulse circuit 23. The pulse circuit 23 includes a comparator 30, a delaying element 31 and an AND circuit 32.

The comparator 30 compares the voltage $V_q$ in the output of the APD 21 (the input of the quenching circuit 22) with the reference voltage $V_{REF}$. If the condition $V_q \geq V_{REF}$ holds, the amplitude of pulses in the output signal of the comparator 20 becomes greater than cases when the condition $V_q < V_{REF}$ holds.

The delaying element 31 delays the pulses in the output signal of the comparator 30. For example, the delay caused by the delaying element 31 can be configured to values smaller than the dead time of the APD 21. Thereby, it is possible to prevent the pulses corresponding to different photons to overlap in the electric signals. The AND circuit 32 generates the logical AND between the pulses entered from the comparator 30 and inverted signal of pulses delayed by the delaying element 31. The pulse circuit 23 presented in FIG. 4 is only an example. Therefore, it is possible to use a circuit with different configurations to form the shapes of pulses in the output signals of the APD 21.

Figure 5:
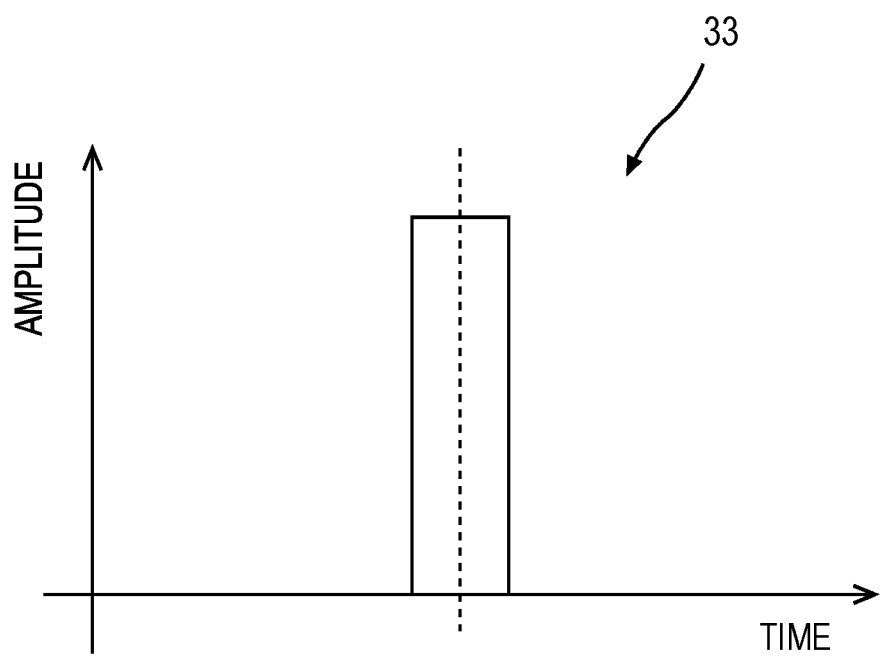
FIG. 5 is a graph showing an example of a pulse in the output signal of the pulse circuit.

Thereby, the pulse circuit 23 generates an approximately rectangular shaped pulse rising when the voltage $V_q$ is equal to the reference voltage $V_{REF}$. The generated approximately rectangular shaped pulse has a pulse width equal to the delay caused by the delaying element 31. FIG. 5 is a graph showing an example of a pulse 33 in the output signal of the pulse circuit 23. The horizontal axis of FIG. 5 represents the time. The vertical axis of FIG. 5 represents the amplitude of electric signals. Examples of the amplitude include the current and the voltage. If an avalanche photo diode with short dead time is used as the APD 21 and the delay caused by the delaying element 31 is set to a short time, the width of the pulse 33 in the output signal of the pulse circuit 23 becomes smaller. If pulses with small widths need to be counted, edge detection with expensive high frequency circuits is required.

To avoid the use of expensive circuits, the waveform shaping circuit 24 connected to the output terminal of the pulse circuit 23 changes the shapes of the approximately rectangular pulses (for example, pulse 33 in FIG. 5) to other shapes. Examples of the pulses after the changing of shapes include the approximately triangular shaped pulse 34 presented in the top of FIG. 6 and the sinc function-shaped pulse 35 presented in the bottom of FIG. 6. Also, the waveform shaping circuit 24 may shape the pulses into Gaussian curve-shaped pulses. By changing the shapes of the pulses, it is possible to reduce the frequency bandwidth required to transmit the electric signals. The shapes of the pulses mentioned above are only examples. As long as the pulse could be transmitted by using narrower frequency bandwidth compared to the approximately rectangular shaped pulses, the pulses may be changed to any other shape In above, a pulse circuit 23 which shapes the pulses in the output signal of the APD 21 to approximately rectangular shaped pulses, was described. However, the pulse circuit may form the pulses in the output signal of the APD to other shapes. For example, if the light source 10 emits electromagnetic waves with pulses of shapes other than the approximately rectangular shape, the pulse circuit 23 may shape the pulses in the electric signals to shapes which are similar to that of the pulses in the emitted electromagnetic waves.

In the following, the pulse being formed by the pulse circuit is called the first pulse. The shape of the first pulse is called the first shape. Also, the pulse being formed by the waveform shaping circuit is called the second pulse. The second pulse can be transmitted by using narrower frequency bandwidth compared to the first pulse.

Figure 7:
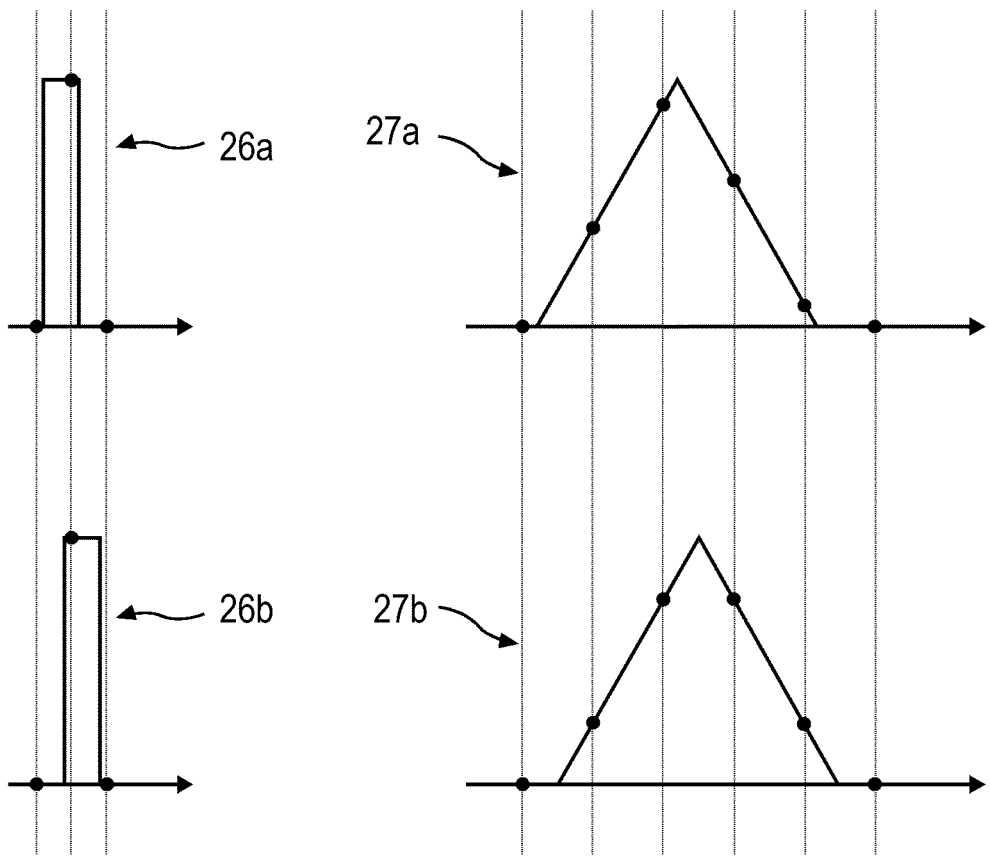
FIG. 7 is a diagram showing the sampling periods needed for different waveforms of pulses.

FIG. 7 is a diagram showing the sampling periods needed for different waveforms of pulses. If electric signals are sampled to detect approximately rectangular shapes pulses like pulses 26a and 26b, it is difficult to determine whether the sampled peak of amplitude corresponds to the rising part of the pulse or the falling part of the pulse. Therefore, if the rising time of the pulse and the falling time of the pulse are estimated only by using the sampled amplitudes, the estimated time may include errors equal to the pulse width, in maximum. Therefore, the edge detection is necessary to estimate the accurate rising time of pulses and falling time of approximately rectangular pulses.

However, if pulses 27a and 27b are used, it is possible to estimate the timing of pulses when the amplitudes are being sampled. For example, if the pulses are approximately triangular shaped, there is a correlation between the amplitude and time. Therefore, it is possible to estimate the central time of pulse and rising time of pulse by executing mathematical calculations. Also, if approximately triangular shaped pulses like the pulses 27a and 27b are used, it is possible to set the sampling period to values which are longer compared to cases when approximately rectangular shaped pulses are detected. Therefore, it is possible to detect pulses without the use of expensive high sampling rate A/D converters or sampler circuits. Also, the edge detection process is no longer necessary.

Figure 8:
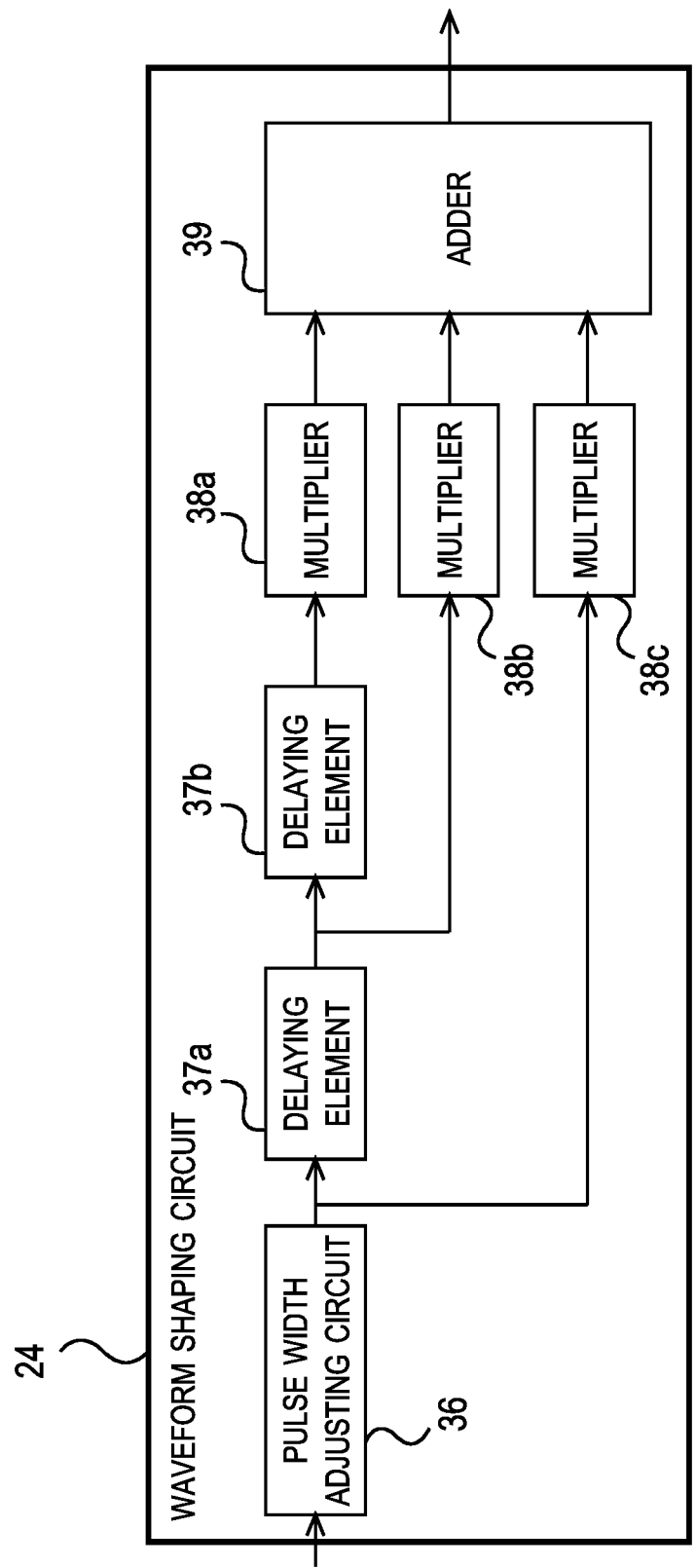
FIG. 8 is a diagram presenting an example of the waveform shaping circuit according to the first embodiment.

Next, the configuration of the waveform shaping circuit 24 is explained. FIG. 8 is a diagram presenting an example of the waveform shaping circuit according to the first embodiment. The waveform shaping circuit 24 includes a pulse width adjusting circuit 36, a delaying element 37a, a delaying element 37b, a multiplier 38a, a multiplier 38b, a multiplier 38c and an adder 39.

The pulse width adjusting circuit 36 adjusts the pulse width of approximately rectangular shaped pulses in the electric signal. Details of the pulse width adjusting circuit 36 are described later. If the adjustment of pulse width is not necessary, configurations without the pulse width adjusting circuit 36 may be used. The output signal of the pulse width adjusting circuit 36 branches and enters the element 37a and the multiplier 38c. The electric signal delayed by the delaying element 37a branches and enters the delaying element 37b and the multiplier 38b. Finally, the electric signal delayed by the delaying element 37a and the delaying element 37b are entered to the multiplier 38a.

The delaying element 37a and the delaying element 37b delay the electric signal. The length of the delayed time is not limited. The multipliers 38a, 38b and 38c multiply a certain coefficient to the entered electric signal. The values of the coefficients are not limited.

Figure 9:
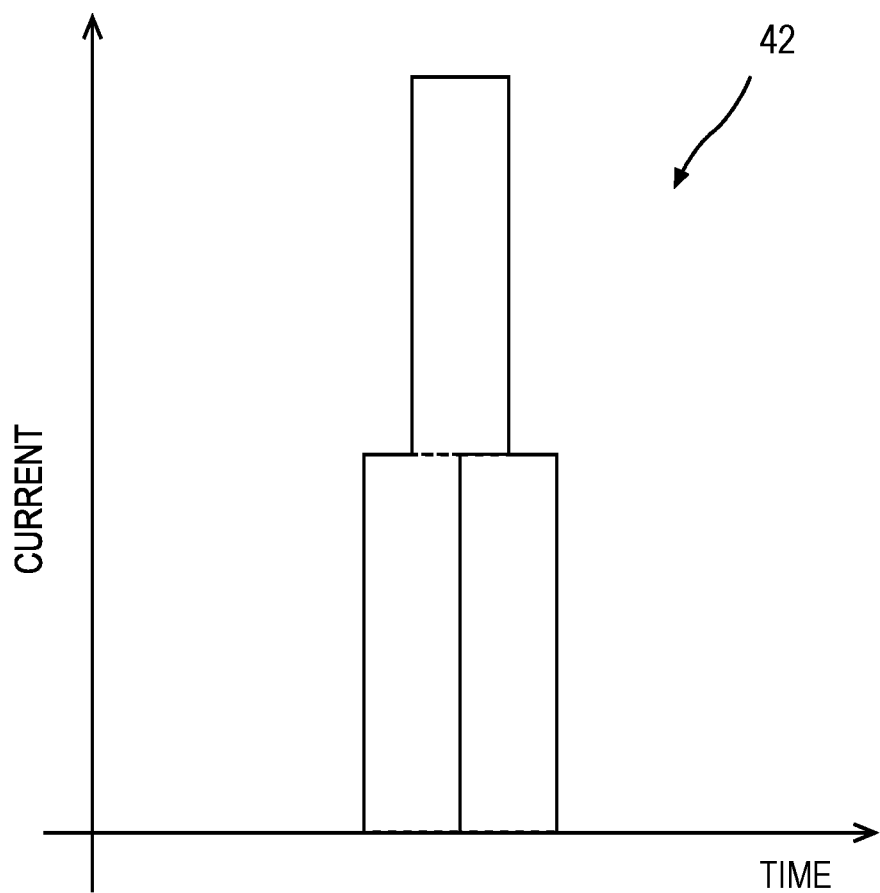
FIG. 9 is a graph showing an example of a pulse in the output signal of a waveform shaping circuit.

The adder 39 is a digital adder which adds electric signals entered from the multipliers 38a, 38b and 38c. The output signal of the adder 39 becomes the output signal of the waveform shaping circuit 24. FIG. 9 is a graph showing an example of a pulse 42 in the output signal of a waveform shaping circuit 24. Referring to FIG. 9, a plurality of approximately rectangular shaped pulses are combined in the time domain and amplitude direction to form a pulse with greater width and amplitude. The base of the pulse 42 has a width equal to two approximately rectangular shaped pulses. The amplitude of pulse 42 is equal to the sum of amplitude of two approximately rectangular shaped pulses.

The configuration of the waveform shaping circuit 24 presented in FIG. 8 is only an example. Therefore, circuits with different configurations may be used. In the example of FIG. 8, two delaying elements are connected in series. Output signals from three multipliers are entered to the adder. However, the number of delaying elements N and the number of multipliers N+1 can take different values. Here, N is a positive integer. The pulse generated by the waveform shaping circuit has a base width equal to N approximately rectangular shaped pulses. The amplitude of the pulse generated by the waveform shaping circuit equals to the sum of N approximately rectangular shaped pulses. By setting the value N to a large number, it is possible to generate approximately triangular shaped pulses.

Also, the values of the coefficients used by the multipliers can be adjusted to change the shape of the pulses generated by the waveform shaping circuit 24. If the coefficients are set to a greater number, the amplitude of the generated pulses would be greater. Also, the delay caused by the delaying elements can be a constant value or different values depending on the delaying element. By adjusting the delay time of the delaying elements, it is possible to generate pulses with shapes other than the approximately triangular shape.

Figure 10:
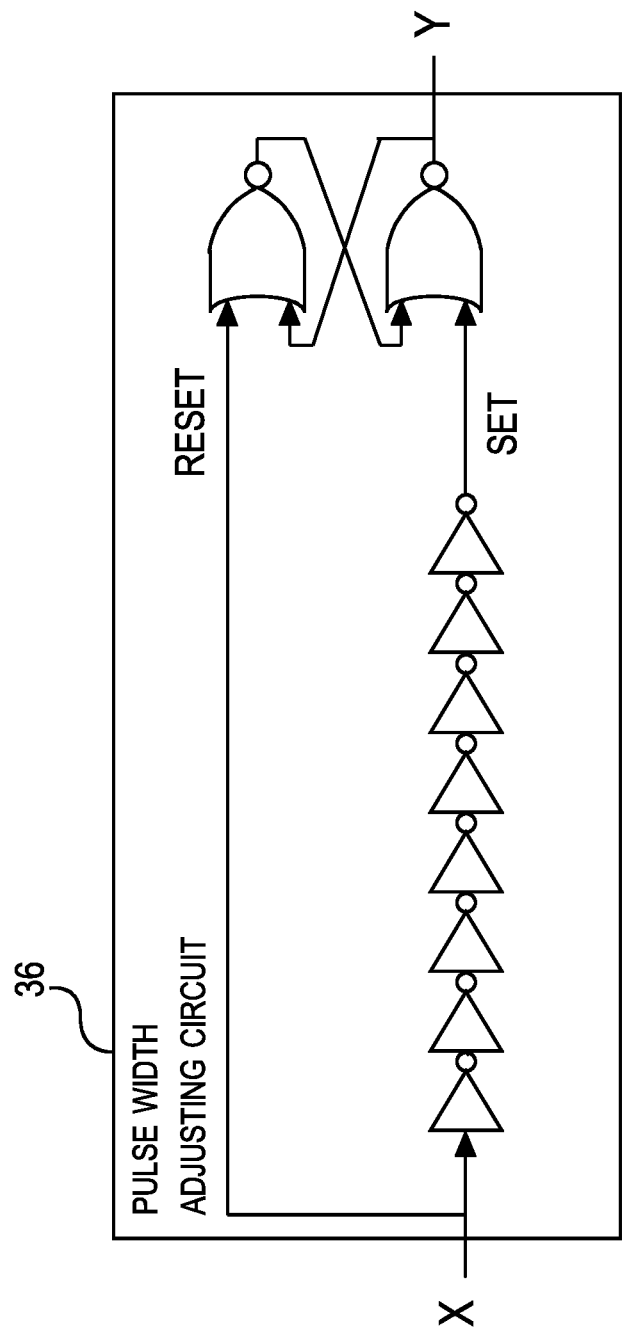
FIG. 10 is a diagram presenting an example of a pulse width adjustment circuit.

FIG. 10 is a diagram presenting an example of a pulse width adjustment circuit 36. The pulse width adjustment circuit 36 includes an inverter chain and a RS flip-flop circuit. The output of the inverter chain is connected to the SET input of the RS flip-flop circuit. Also, the input signal X to the pulse width adjustment circuit 36 is entered directly to the reset input of the RS flip-flop circuit. If the input signal X changes from 0 to 1 in the pulse width adjustment circuit 36, the output signal Y is set to 1. If the delay time of the inverter chain elapses, the output of the inverter chain would become 1 as well. In this case, the value of output Y becomes 0 regardless of the value of the input signal X.

In the pulse width adjustment circuit 36 of FIG. 10, a pulse with width equal to the delay time of the inverter chain is in the output signal Y, regardless of the timing when the value of the input signal X changes from 1 to 0. Thus, the pulse width does not depend on the falling timing of the input signal X. By using the pulse width adjustment circuit 36, it is possible to set the widths of the pulses in the electric signal to a certain value. For example, if the pulse width of the pulses in the electric signals entering from the pulse circuit 23 is small, it is possible to change the pulse width to a larger value. Then, it is possible to reduce the frequency band width required to transmit the electric signals and the sampling frequencies. However, the pulse width adjustment circuit 36 may change the pulse width to a smaller value. The circuit presented in FIG. 10 is only an example of the pulse width adjustment circuit. Thus, circuits with a different configuration can be used to adjust the pulse width of pulses in the electric signal.

Referring to FIG. 3 again, the detection circuit according to the first embodiment is described. The output signal of the waveform shaping circuit 24 is entered to the adder 25. As presented in the configuration of FIG. 3, the output signals from a plurality of branches including the avalanche photo diode and the quenching circuit are entered to the adder. Therefore, it is possible to prevent the variations in the characteristics of elements to affect the overall accuracy of photon detection.

The adder 25 adds the electric signals entered from the N branches. The output signal of the adder 25 becomes the output signal of the detection circuit 11. The adder 25 can be an analog adder or a digital adder. Thus, the type of adder to be used is not limited.

The detection circuit 11 can be a monolithic complementary metal oxide semiconductor device implementing the array of the avalanche photodiode (APD 21), the quenching circuit 22, the pulse circuit 23, the waveform shaping circuit 24 and the adder 25. Each component can be implemented in separate chips. Thus, the detection circuit can be implemented using any kind of form.

By using the detection circuit according to the first embodiment, the signal processing circuits connected to the output terminal can estimate the peak time of pulses by referring to the amplitude of pulses, without detecting the edges of signal. Therefore, it is not necessary to obtain the timing of pulses by TDCs (Time/Digital Converters). If the output signals of the detection circuit are analog signals, it is possible to obtain the timing of the pulses by using A/D converters. If output signals of the detection circuit are digital signals, it is possible to obtain the timing of pulses by using flip-flops. In such cases, it is not necessary to use high sampling rate A/D converters or flip-flops operating in high clock frequencies.

After the timing of pulses are obtained by using TDCs (Time/Digital Converters), the results obtained by the TDCs needed to be saved. The amplitude and the timing of the reflected light 4 were estimated based on histogram calculation. If the detection circuit according to the embodiment is used, the above process of saving of data and histogram calculation are not required. Thus, it is possible to reduce the circuit area and consumption of electricity.

Second Embodiment

The waveform shaping circuit according to the first embodiment added electric signals from each branch by using a digital adder. However, the waveform shaping circuit described in the first embodiment is only an example. For example, it is possible to add signals by using analog adders to generate the shaped pulses. In the following, an example of a waveform shaping circuit which uses an analog adder is described.

Figure 11:
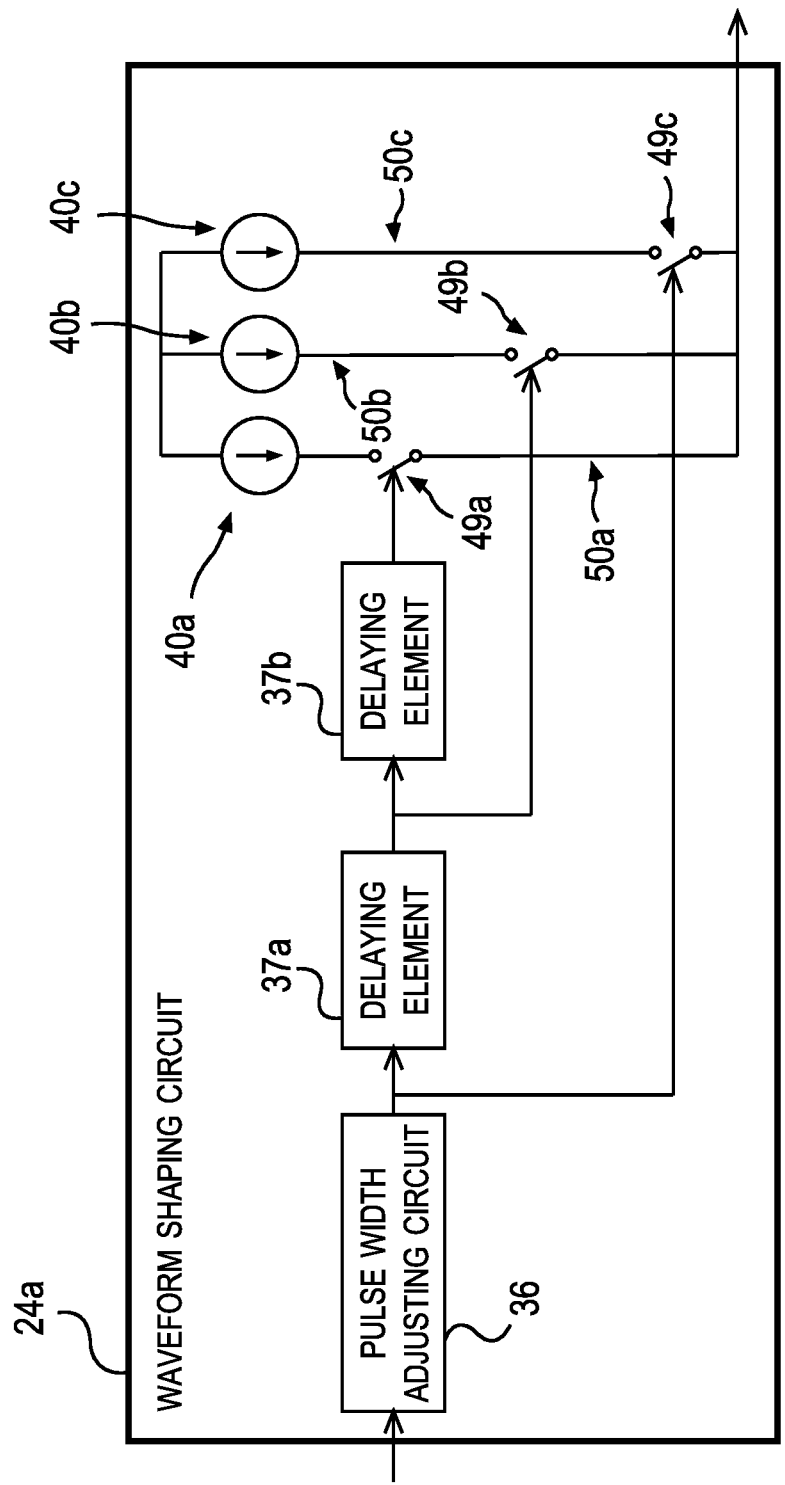
FIG. 11 is a diagram presenting a configuration example of the waveform shaping circuit according to a second embodiment.

FIG. 11 is a diagram presenting a configuration example of the waveform shaping circuit according to a second embodiment. The waveform shaping circuit 24a includes a pulse width adjusting circuit 36, a delaying element 37a, a delaying element 37b, a current source 40a, a current source 40b, a current source 40c, a switch 49a, a switch 49b and a switch 49c. Similar to the first embodiment, the delay time of the delaying elements 37a and 37b are not limited.

On the transmission line 50a, the current source 40a and the switch 49a are connected in series. Similarly, on the transmission line 50b, the current source 40b and the switch 49b are connected in series. On the transmission line 50c, the current source 40c and the switch 49c are connected in series. The transmission lines 50a, 50b and 50c are connected in parallel.

The current source 40a provides a constant current to the transmission line 50a, when the switch 49a on the transmission line 50a is turned on. The current source 40b provides a constant current to the transmission line 50b, when the switch 49b on the transmission line 50b is turned on. The current source 40c provides a constant current to the transmission line 50c, when the switch 49c on the transmission line 50c is turned on. The current sources 40a, 40b and 40c can be configured with combinations of DC power sources and resistors. However, the implementation of the current sources is not limited. The currents provided by each current source could be equal. Also, the currents provided by each current source could be different. As long as the directions of currents provided by each current source are uniform, the direction of the currents can be the opposite of FIG. 11.

The switch 49a operates based on the voltage applied from the input terminal. Similarly, the switch 49b operates based on the voltage applied from the input terminal. The switch 49c operates based on the voltage applied from the input terminal. The switches can be implemented by FETs (field-effect transistors). However, other devices can be used to implement the switches. If FETs are used, the gate terminal of the FET corresponds to the input terminal of the switch.

The pulse width of the approximately rectangular shaped pulse in the input signal of the waveform shaping circuit 24a is adjusted by the pulse width adjusting circuit 36. If the adjustment of pulse width is not necessary, a configuration without the pulse width adjusting circuit 36 can be used. The output signal of the pulse width adjusting circuit 36 branches and enters to the delaying element 37a and the switch 49c. The signal delayed by the delaying element 37a branches and enters to the switch 49b and the delaying element 37b. Finally, the signal delayed by the delaying element 37a and the delaying element 37b enters to the switch 49a. The output signal of the waveform shaping circuit 24a is obtained from the junction of the transmission lines 50a, 50b and 50c.

It is possible to obtain the pulse 42 in FIG. 9 as the output signal by using the waveform shaping circuit 24a. The circuit of FIG. 11 includes three switches and three current sources. However, the number of elements in the circuit could be different. For example, it is possible to configure a circuit with M delaying elements and M+1 switches and current sources. Here, M is a positive integer. By adjusting the value M, the current provided by the current sources and the delay time of the delaying elements, it is possible to modify the shapes of the pulses included in the output signal.

Third Embodiment

The waveform shaping circuit according to the second embodiment used an analog adder. However, different circuits could be used to add electric signals from the plurality of branches. In the waveform shaping circuit according to the second embodiment, shaped pulses are provided in the form of current signals. However, the shaped pulses could be provided in the form of voltage signals. In the third embodiment, another example of a circuit executing analog additions is described.

Figure 12:
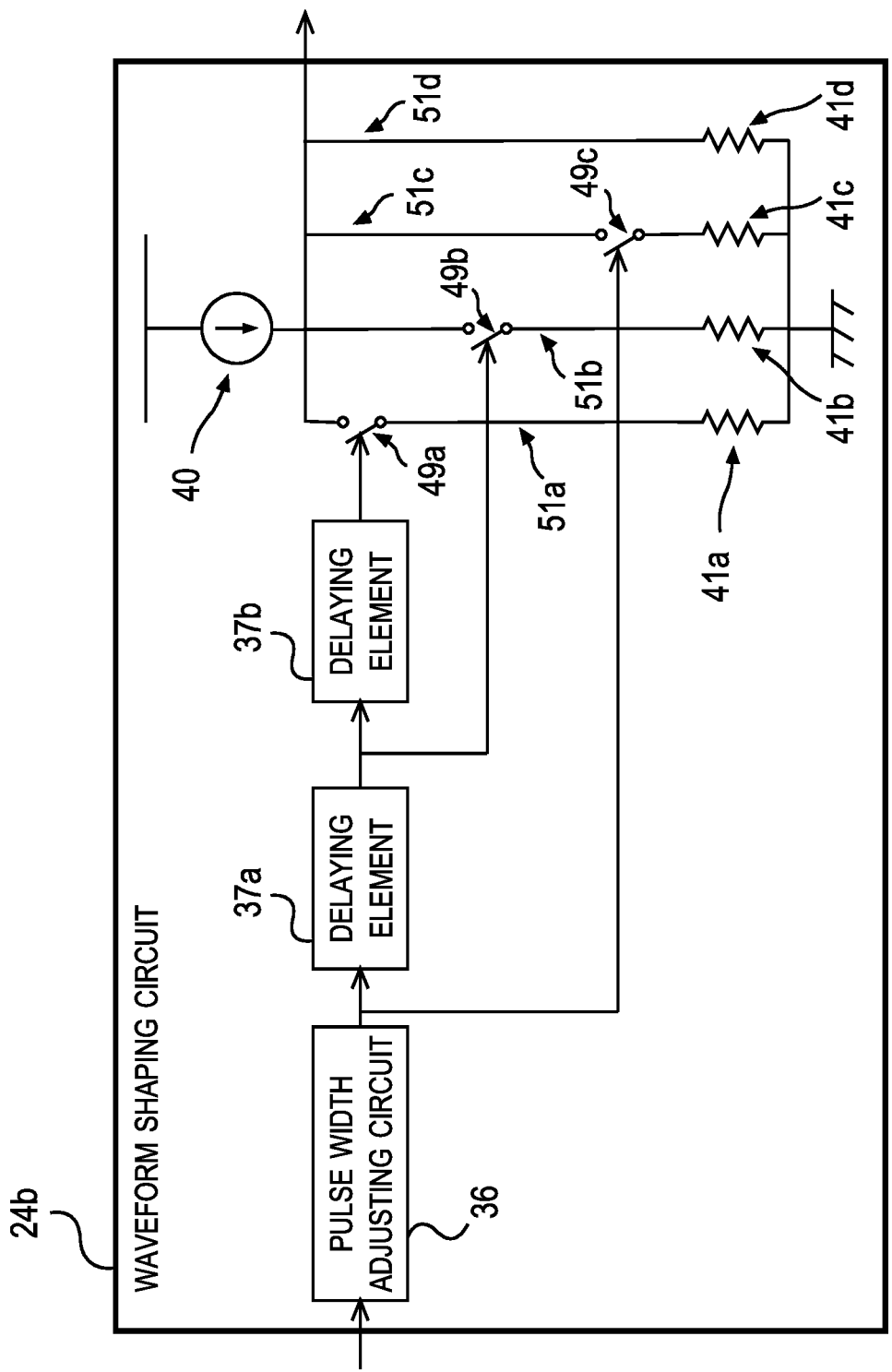
FIG. 12 is a diagram presenting a configuration example of the waveform shaping circuit according to a third embodiment.

FIG. 12 is a diagram presenting a configuration example of the waveform shaping circuit according to a third embodiment. The waveform shaping circuit 24b in FIG. 12 includes a pulse width adjusting circuit 36, a delaying element 37a, a delaying element 37b, a current source 40, a switch 49a, a switch 49b, a switch 49c, a resistor 41a, a resistor 41b, a resistor 41c and a resistor 41d. As in the first and second embodiments, the delay times of the delaying element 37a and the delaying element 37b are not limited.

On a transmission line 51a, the switch 49a and the resistor 41a are connected in series. On a transmission line 51b, the switch 49b and the resistor 41b are connected in series. On a transmission line 51c, the switch 49c and the resistor 41c are connected in series. Also, the resistor 41d is located on a transmission line 51d. The transmission lines 50a, 50b, 50c and 51d are connected in parallel. The edges of the transmission lines 50a, 50b, 50c and 51d with the resistors are connected to a ground. Examples of the ground include the reference voltages of the waveform shaping circuit 24b, the detection circuit 11 and the electronic apparatus 1. Other edges of the transmission lines 50a, 50b, 50c and 51d are connected to the current source 40.

The direct current provided by the current source 40 is provided to the transmission line 51d and the transmission lines 50a, 50b, 50c and 51d. The current source 40 can be configured with a combination of a DC power source and resistors. However, the implementation of the current source 40 is not limited. The value of current and the direction of current generated by the current source 40 are not limited.

The switch 49a operates based on the voltage applied to the input terminal. Similarly, the switch 49b operates based on the voltage applied to the input terminal. The switch 49c operates based on the voltage applied to the input terminal. The switches can be implemented by FETs (field-effect transistors). However, other devices can be used to implement the switches. If FETs are used, the gate terminal of the FET corresponds to the input terminal of the switch.

The pulse width of the approximately rectangular shaped pulse in the input signal of the waveform shaping circuit 24b is adjusted by the pulse width adjusting circuit 36. It the adjustment of pulse width is not necessary, a configuration without the pulse width adjusting circuit 36 can be used. The output signal of the pulse width adjusting circuit 36 branches and enters to the delaying element 37a and the switch 49c. The signal delayed by the delaying element 37a branches and enters to the switch 49b and the delaying element 37b. Finally, the signal delayed by the delaying element 37a and the delaying element 37b is entered to the switch 49a. The output signal of the waveform shaping circuit 24b is obtained from the terminal between edges of the transmission lines 50a to 50c and the current source 40.

Figure 13:
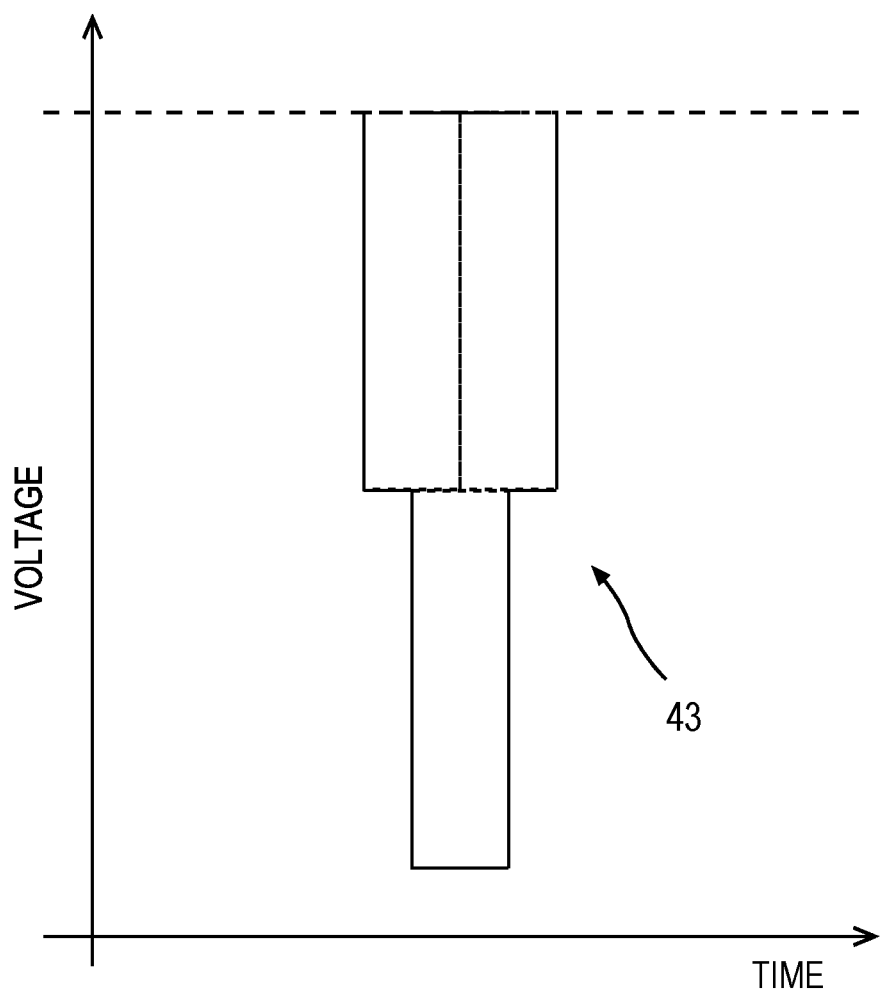
FIG. 13 is a graph showing an example of a pulse in the output signal of the waveform shaping circuit according to the third embodiment.

By using the waveform shaping circuit 24b, it is possible to obtain output signals including the pulse 43 in FIG. 13.

The vertical axis of the graph in FIG. 13 represents the voltage. The horizontal axis of the graph in FIG. 13 represents the time. FIG. 13 shows the shaped pulses are provided in the form of electric voltage signals.

The circuit of FIG. 12 includes two delaying elements and three switches. However, the number of elements in the circuit could be different. For example, it is possible to configure a circuit with L delaying elements and L+1 switches. Here, L is a positive integer. By adjusting the value L, the current provided by the current sources and the delay time of the delaying elements, it is possible to modify the shapes of the pulses included in the output signal.

Fourth Embodiment

Figure 14:
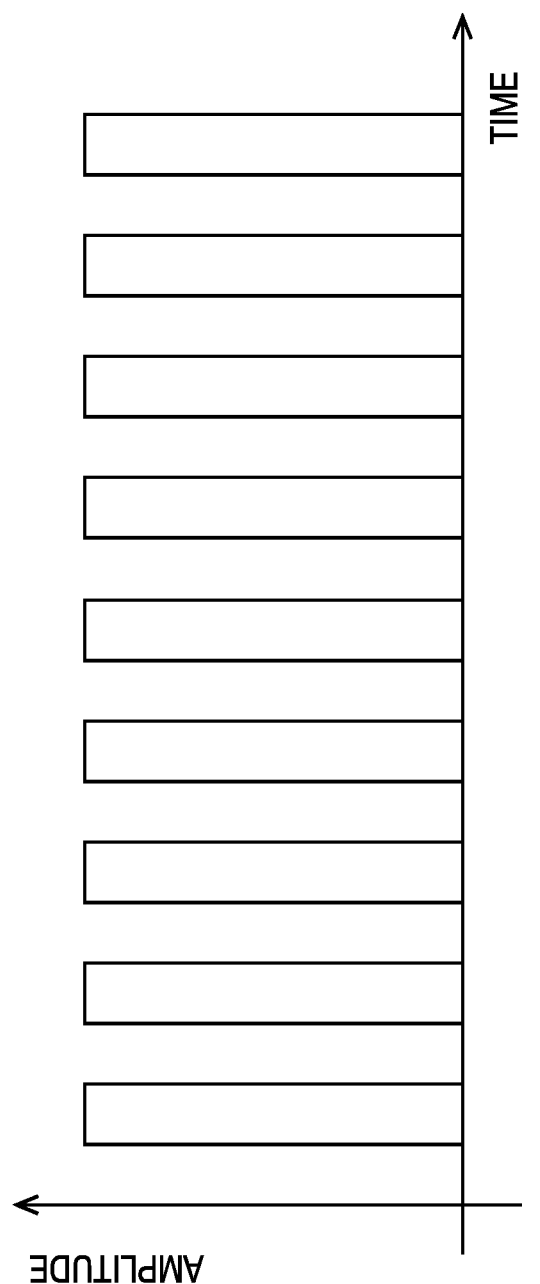
FIG. 14 is a graph showing an example of the output signal of the pulse circuit when APDs with short dead times are used.

If avalanche photo diodes (APDs) with short dead times are used, pulses in the electric signals are generated with short intervals. Although the pulse circuit forms the pulses into approximately rectangular shapes, the intervals between the pulses are short. FIG. 14 is a graph showing an example of the output signal of the pulse circuit when APDs with short dead times are used. In the graph of FIG. 14, the vertical axis represents the amplitude of the electric signals. The horizontal axis represents the time. The amplitude of the electric signals may be the current, the voltage, the power or any other physical value.

Figure 15:
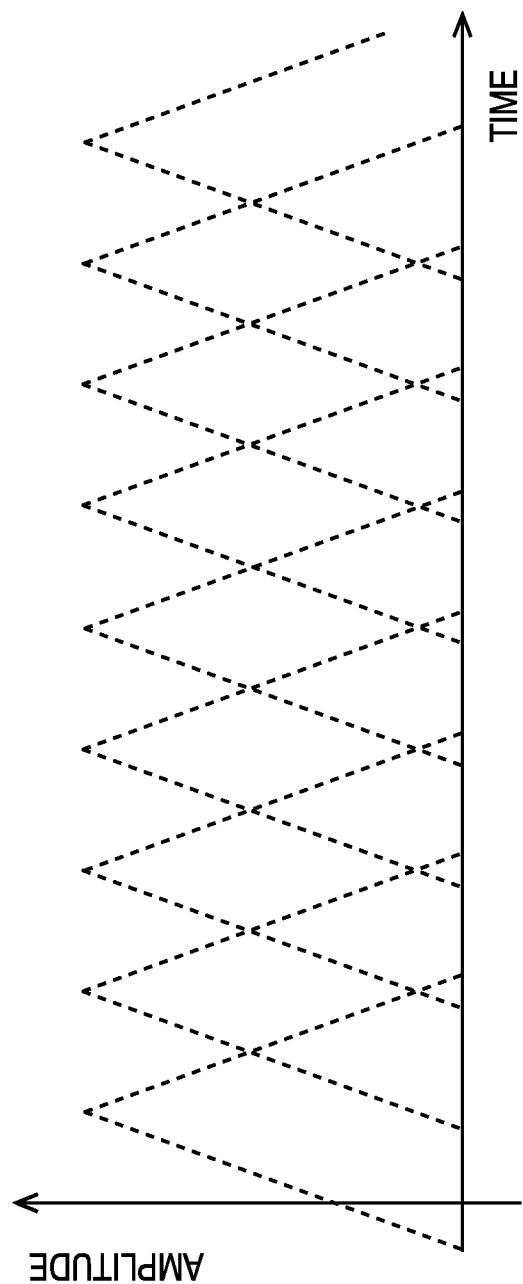
FIG. 15 is a graph showing overlaps of pulses when waveform shaping is applied to the output signal of the pulse circuit, when APDs with short dead tunes are used.

If the electric current of FIG. 14 is provided to the waveform shaping circuit, the waveform shaping circuit changes the approximately rectangular shaped pulses into approximately triangular shaped pulses, as shown in FIG. 15. Referring to the graph of FIG. 15, the pulses are overlapping in the time domain. Thus, it is difficult to distinguish each of the pulses. If APDs with short dead time are used, measures to prevent the overlapping of pulses need to be performed before the shaping of pulses.

Also, if the detection circuit 11 includes many APDs, the wiring length of the circuit becomes large. For example, in high density devices such as MPPCs, APDs are implemented for each pixel. Thus, the number of the APDs could be in the order of thousands or even more. Also, time interleave is used for reading a plurality of MPPC chips with a common reading circuit. Thus, there have been cases when the use of circuits capable of transmitting large frequency bandwidths was necessary.

In the detection circuit according to the fourth embodiment, a demultiplexer is used to assign each of the pulses to different channels. Then, the pulses are shaped in each of the channels. Below, the detection circuit according to the fourth embodiment is described.

Figure 16:
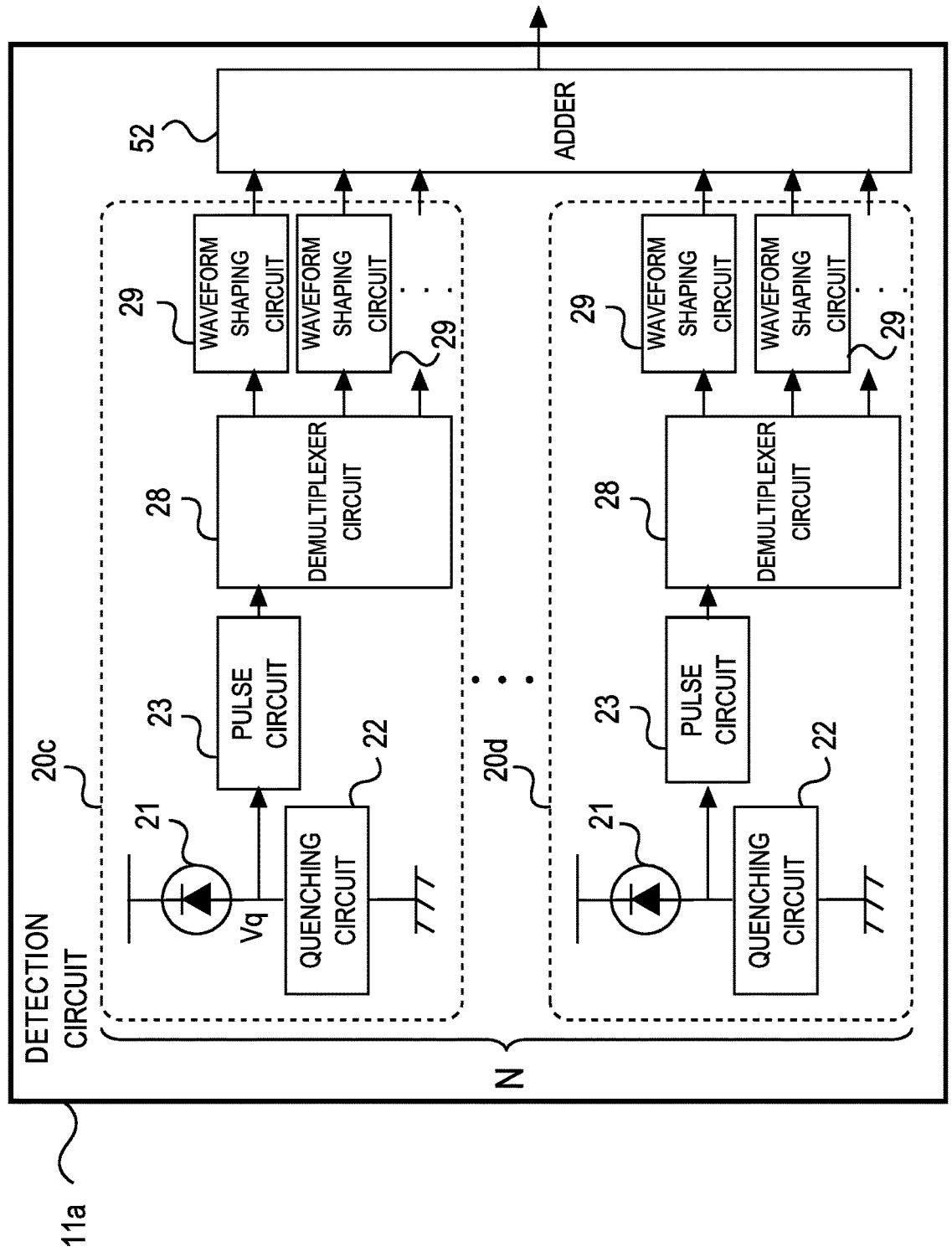
FIG. 16 is a diagram presenting a configuration example of the detection circuit according to a fourth embodiment.

FIG. 16 is a diagram presenting a configuration example of the detection circuit according to a fourth embodiment. In a detection circuit 11a, a plurality of branches (for example, N branches including branches 20c and 20d) is connected to the input side of the adder 52, in parallel. The output signal of the adder 52 becomes the output signal of the detection circuit 11a. The N branches in the detection circuit 11a each include an APD 21 and a quenching circuit. The output signals of each of the branches are entered to the adder 52. The detector circuit 11a operates as a circuit to detect electromagnetic waves (for example, visible light) by using a plurality of avalanche photo diodes.

The configurations for each of the N branches in the detection circuit 11a are uniform. In the following, the configuration of branch 20c is explained as an example.

The branch 20c of the circuit includes an APD 21, a quenching circuit 22, a pulse circuit 23, a demultiplexer circuit 28 and a plurality of waveform shaping circuits 29.

The configurations and the features of the APD 21, the quenching circuit 22 and the pulse circuit 23 are similar to the corresponding components in the detection circuit according to the first embodiment. In the fourth embodiment, the demultiplexer circuit 28 is connected to the next stage of the pulse circuit 23. The demultiplexer circuit 28 detects the pulses in the output signal of the pulse circuit 23. Then, the demultiplexer circuit 28 assigns the pulses to each of the channels (channels #0-#n) after a delay time.

Then, the waveform shaping circuits 29 in each of the channels changes the shapes of the assigned pulses to shapes which reduce the frequency bandwidth that is necessary to transmit the electric signals. The pulses can be shaped to approximately triangular shape pulses, sinc function shapes or Gaussian curve shapes. Pulses can be shaped to any other shapes. The features and configuration of the waveform shaping circuits 29 is similar to that of the waveform shaping circuit 24 according to the first embodiment. Since each channel has a waveform shaping circuit 29, the number of waveform shaping circuits 29 in each of the branches is equal to the number of channels (n+1) in the demultiplexer circuit 28.

Figure 17:
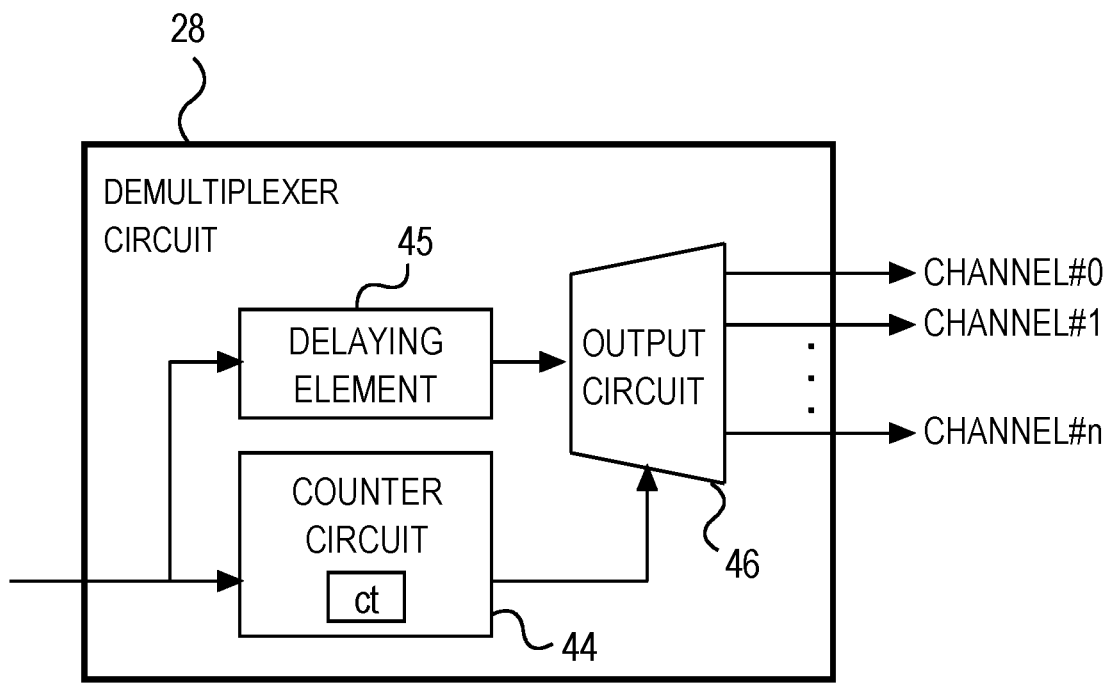
FIG. 17 is a diagram presenting an example of a demultiplexer circuit.

Next, details of the demultiplexer circuit 28 are described. FIG. 17 is a diagram presenting an example of a demultiplexer circuit. The demultiplexer circuit 28 includes a counter circuit 44, a delaying element 45 and an output circuit 46. The counter circuit 44 detects the pulses in the input signal of the demultiplexer circuit 28. When the counter circuit 44 detects pulses, the value of the internal counter ct is incremented by 1. However, the counter can be updated differently when pulses are detected. For example, the counter may be decremented by 1. When pulses are detected, values other than 1 can be added to the value of the counter. When pulses are detected, values other than 1 can be subtracted from the value of the counter.

The maximum value of the counter $ct_{MAX}$ is configured to a positive integer n. Therefore, if the counter circuit 44 detects a pulse when the equation ct=n holds, an irregular operation is executed. In this case, the counter is not incremented by 1. Instead, the value of the counter is set to ct=0. This is known as the wrap-around operation of the counter.

If the value of the counter in the counter circuit 44 is updated, the pulse is entered to the delaying element 45. The delaying element 45 delays the entered pulse. Therefore, the pulse is entered to the output 46 with delay time compared to the original timing.

The output circuit 46 assigns the pulse to the channel with the channel number equal to the value of the counter ct. Thus, the pulse becomes the output signal of the corresponding channel. For example, if ct=0, the pulse becomes the output signal of channel #0. If ct=1, the pulse becomes the output signal of channel #1. If ct=2, the pulse becomes the output signal of channel #2. However, this relationship between the value of the counter and the assigned channel is only an example. For example, the pulses may be assigned to the channel with numbers equal to the residue of the counter value ct. In the example of FIG. 17, the maximum value of the counter $ct_{MAX}$ and the maximum value of the channel number are both n. However, the maximum value of the counter and the maximum value of the channel number do not always need to be equal.

Below, the detection circuit 11a is explained with reference to FIG. 16.

The output signals from the plurality of waveform shaping circuits 29 in the branch 20c are entered to the adder 52. The adder 52 adds the electric signals entered from the N branches. Since each of the branches has a plurality of waveform shaping circuits, the number of signals entered to the adder 52 is greater than N. For example, if the number of channels that the demultiplexer circuits each branch has is n, n×m signals are entered to the adder 52. The output signal of the adder 52 becomes the output signal of the detection circuit 11. The adder 52 can be either an analog adder or a digital adder. The type of adder used is not limited.

The detection circuit 11a can be a monolithic complementary metal oxide semiconductor device implementing the array of the avalanche photodiode (APD 21), the quenching circuit 22, the pulse circuit 23, the demultiplexer circuit 28, the waveform shaping circuit 29 and the adder 25. Each component can be implemented in separate chips. Thus, the detection circuit can be implemented by using any kind of form.

By using the detection circuit according to the fourth embodiment, it is possible to make the intervals between the pulses longer. Thus, even in cases when APDs with short dead times are used, the overlaps of pulses are prevented, enabling the shaping of pulses. Also, since the use of high frequency circuits are not necessary, it is possible to use MPPC chips with many pixels. Also, a plurality of MPPC chips can be read by using time interleave.

(First Variation)

The detection circuit according to the fourth embodiment had waveform shaping circuits connected to each of the channels in the demultiplexer circuit. The waveform shaping circuits changed the shapes of the pulses so that the electric signals can be transmitted by using narrower frequency bandwidths. However, some of the functions of the waveform shaping circuit can be omitted.

In the detection circuit according to the first variation, the waveform shaping circuit connected to each of the channels in the demultiplexer circuit only has the function for adjusting the width of the pulses. Therefore, if the pulse width adjusting circuit 36 of FIG. 10 are connected to each of the channels in the demultiplexer circuit, it would be equal to the configuration of the detection circuit according to the first variation. The features of the other components are similar to that of the detection circuit according to the fourth embodiment.

Figure 18:
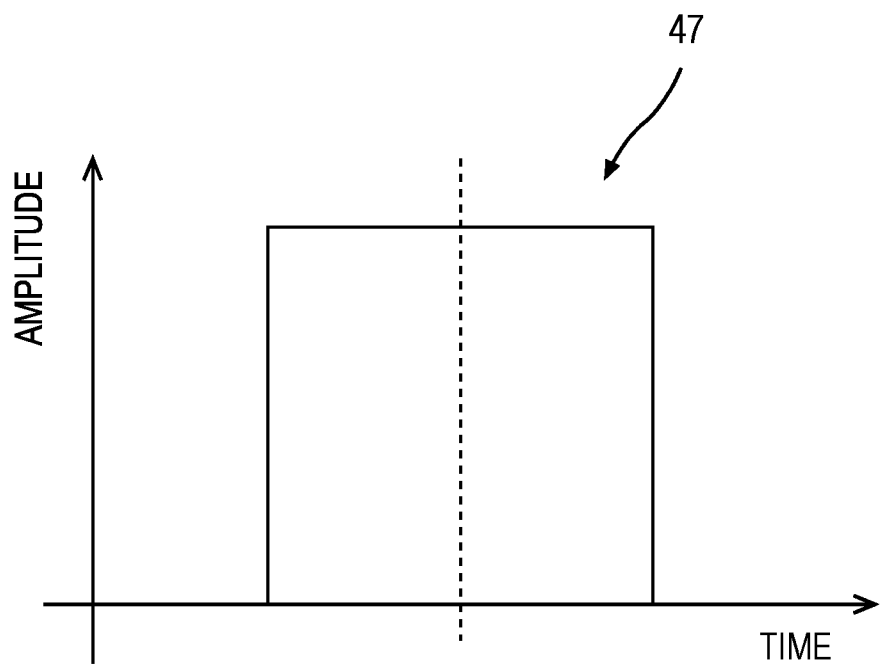
FIG. 18 is a graph showing an example of a pulse in the output signal of the waveform shaping circuit according to a first variation.

FIG. 18 is a graph showing an example of a pulse 47 in the output signal of the waveform shaping circuit according to a first variation. Comparing the pulse 47 with the pulse 33 in FIG. 5, the width of pulse 47 is larger. Therefore, simply by making the pulse width larger, it is possible to reduce the performance requirements (for example, operating frequencies and sampling periods) of the signal processing circuits connected to the next stage of circuit.

(Second Variation)

One of the purposes the waveform shaping circuits were connected to each of the channels in the demultiplexer circuit was to change the shapes of the pulses so that the electric signals can be transmitted without using wide frequency bandwidths. However, circuits other than the waveform shaping circuits can be used to reduce the frequency bandwidth of electric signals. In the following, the detection circuit according to the second variation is described.

Figure 19:
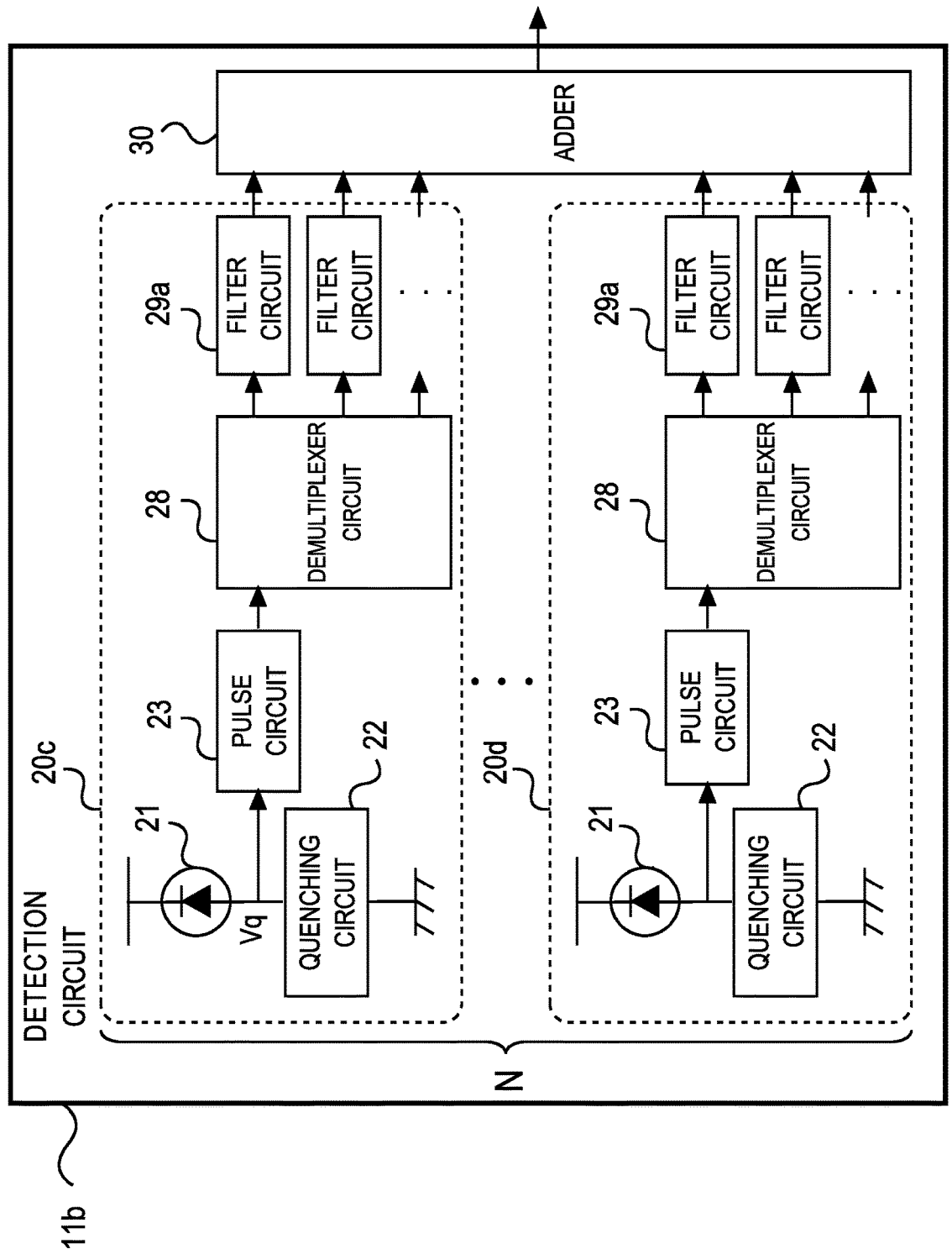
FIG. 19 is a diagram presenting a configuration example of the detection circuit according to a second variation.

FIG. 19 is a diagram presenting a configuration example of the detection circuit according to a second variation. In the detection circuit 11b of FIG. 19, filter circuits 29a are connected to each of the channels (channels #0-#n) in the demultiplexer circuit 28. The output signals for each of the filter circuits 29a are entered to the adder 52.

Examples of the filter circuit 29a include low-pass filters, band-pass filters and notch filters. However, as long as the frequency bandwidth of the entered electric signal is reduced, any type of filter could be used. The filter circuit 29a can be configured only with passive elements. Also, it is possible to configure the filter circuit 29a by using a combination of passive elements and active elements. The filter circuit 29a can be either analog filters or digital filters. Thus, the configurations, the implementations and the types of filters are not limited.

The configurations of other components in the detection circuit according to the second variation are similar to the detection circuit according to the fourth embodiment.

Fifth Embodiment

It is possible to replace the waveform shaping circuits in the detection circuit according to the first embodiment to filter circuits. The detection circuit according to the fifth embodiment uses filter circuits instead of the aforementioned waveform shaping circuits. In the following, the differences between the detection circuit according to the first embodiment and the detection circuit according to the fifth embodiment are described.

Figure 20:
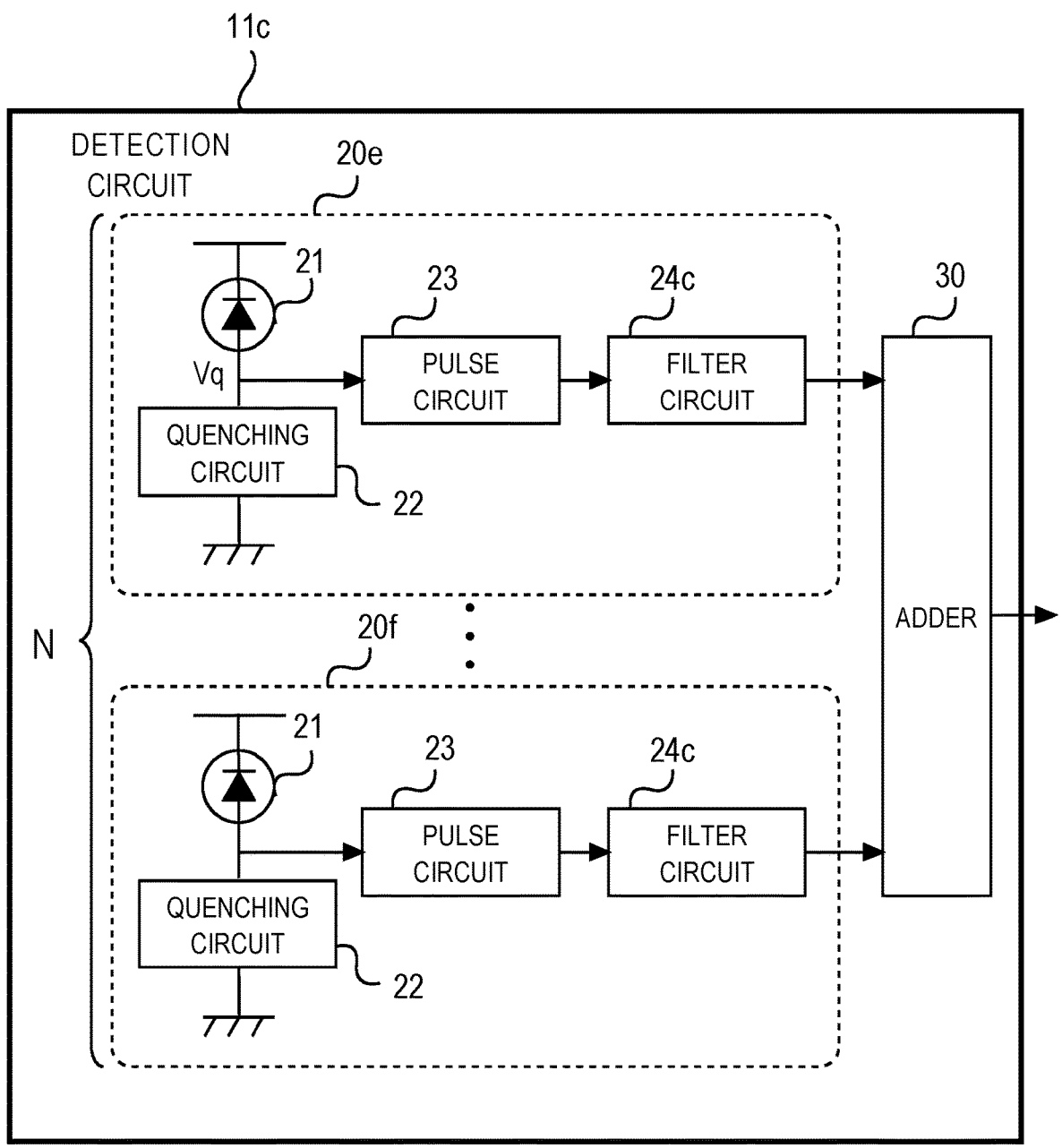
FIG. 20 is a diagram presenting a configuration example of the detection circuit according to a fifth embodiment.

FIG. 20 is a diagram presenting a configuration example of the detection circuit according to a fifth embodiment. The detection circuit 11c of FIG. 20 has a filter circuit 24c instead of the waveform shaping circuit 24. Therefore, the approximately rectangular shaped pulses in the output signal of the pulse circuit 23 are entered to the filter circuit 24c. After part of the frequency bandwidths are rejected by the filter circuit 24c, the pulses are entered to the adder 52.

Examples of the filter circuit 24c include low-pass filters, bandpass filters and notch filters. However, as long as the frequency bandwidth of the entered electric signal is reduced, any type of filter could be used. The filter circuit 24c can be configured only with passive elements. Also, it is possible to configure the filter circuit 24c by using a combination of passive elements and active elements. The filter circuit 24c can be either analog filters or digital filters. Thus, the configurations, the implementations and the types of filters are not limited.

In the second variation and the fifth embodiment, it was explained that the waveform shaping circuits are replaced with the filter circuits. However, if waveform shaping circuits are defined as circuits which shape the waves in the broad sense, the filter circuits also fall into the category of waveform shaping circuits. Thus, it can be said that a filter circuit is a type of waveform shaping circuit.

Sixth Embodiment

In the electronic apparatus according to the first embodiment, an A/D converter was connected to the next stage of the detection circuit. However, this configuration is only an example. Therefore, the components connected to the output terminal of the detection circuit are not limited.

Depending on the output signal of the detection circuit 11, different components can be connected to the output terminal of the detection circuit. The output signal of the detection circuit 11 could be analog signals or digital signals. Also, the digital signals could be either synchronized or non-synchronized. The signals can use different frequency bandwidths. The signals could be electric current signals or electric voltage signals. The amplitude of the signals could be quantized or not quantized. Thus, the output signal of the detection circuit 11 is not limited. In the following, an electronic apparatus according to a sixth embodiment is described, mainly focusing on the difference between the electronic apparatus according to the first embodiment.

Figure 21:
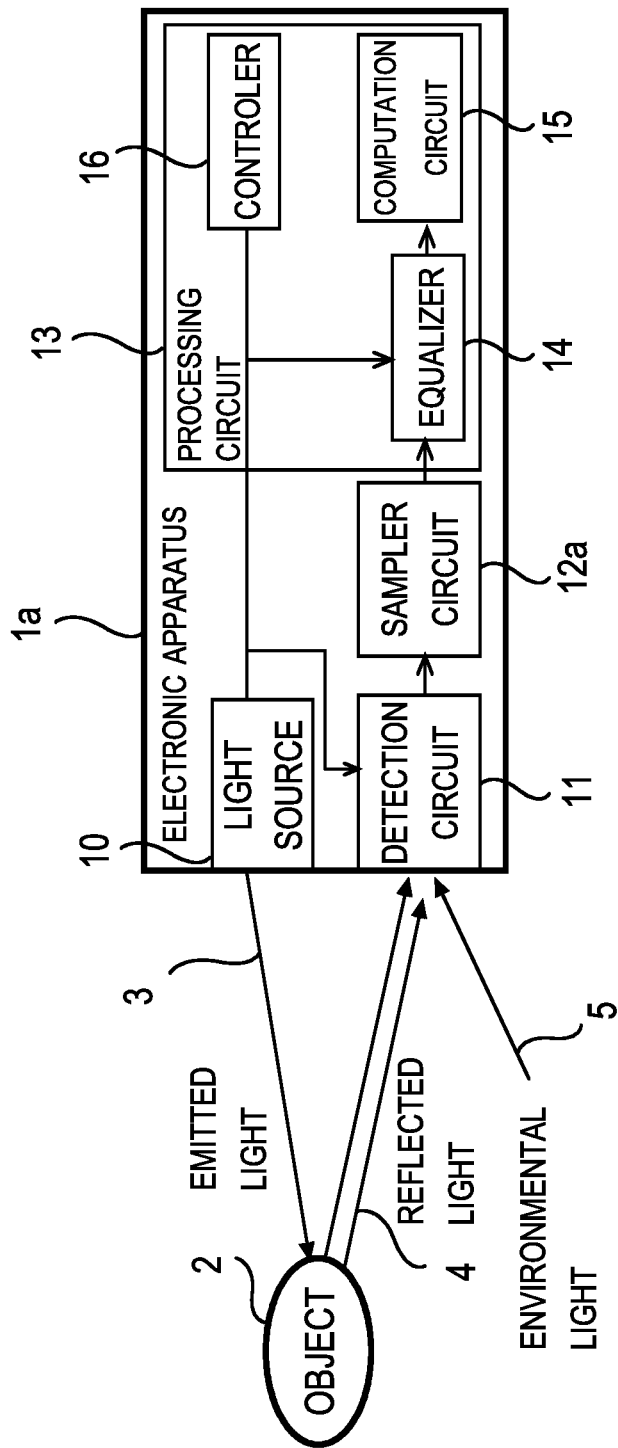
FIG. 21 is a block diagram describing a configuration example of an electronic apparatus according to a sixth embodiment.

FIG. 21 is a block diagram describing a configuration example of an electronic apparatus according to a sixth embodiment. In the electronic apparatus 1a of FIG. 21, a sampler circuit 12a is connected to the next stage of the detection circuit 11, instead of the A/D converter 12. The sampler circuit 12a does not quantize the amplitude of electric signals. However, the sampler circuit 12a executes the sampling of the electric signals. The configuration and features of the other components are similar to the electronic apparatus according to the first embodiment.

Seventh Embodiment

The electronic apparatus according to the first embodiment was a distance measuring device which measures the distance between the device and an object 2. However, the electronic apparatus according to the embodiment is not limited to distance measuring devices. The electronic apparatus can be any type of device as long as it includes the detection circuits described in the above embodiments and variations. For example, the electronic apparatus can be an optical communication device, a laser radar, fluorescence measurement devices, fluorescence microscopes, photon counters, barcode readers, imaging devices, gamma-ray detectors and X-ray detectors.

Figure 22:
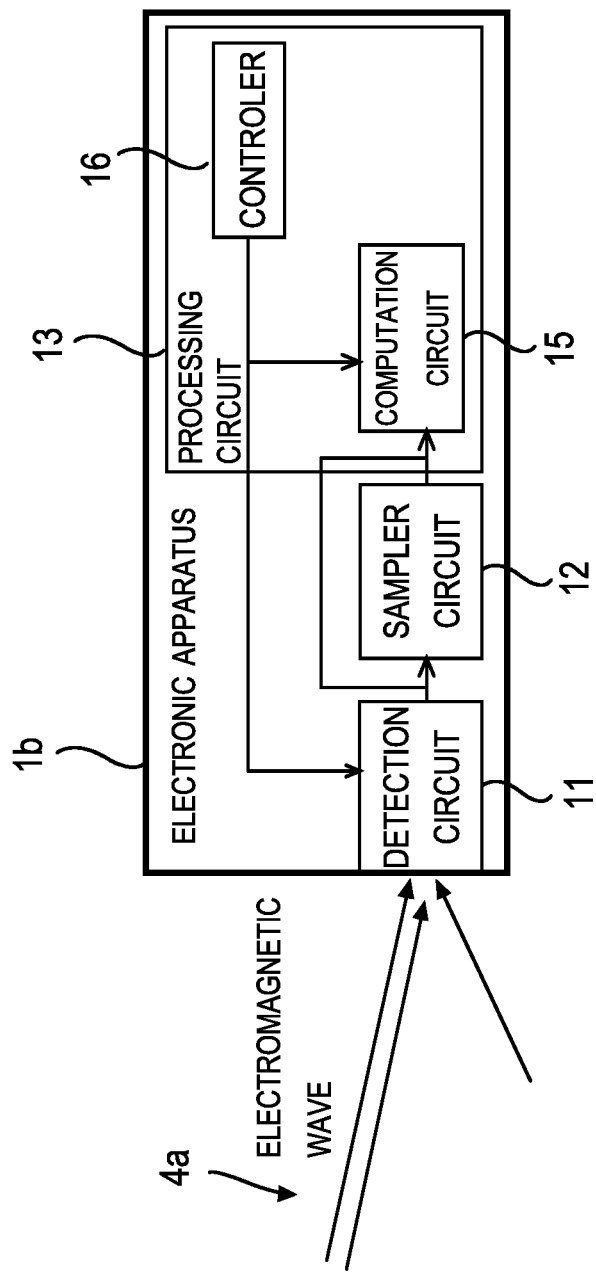
FIG. 22 is a block diagram describing a configuration example of an electronic apparatus according to a seventh embodiment.

In the seventh embodiment, a case when the electronic apparatus is a device which detects electromagnetic waves is explained. FIG. 22 is a block diagram describing a configuration example of an electronic apparatus according to a seventh embodiment. The electronic apparatus 1b in FIG. 22 includes a detection circuit 11, a sampler circuit 12 and a processing circuit 13. The processing circuit 13 includes a computation circuit 15 and a controller 16 as internal components.

The detection circuit 11 converts the incident electromagnetic wave 4a into electric signals. The frequency bandwidth of the detected electromagnetic waves is not limited. The configuration and the feature of the detection circuit 11 could be the same as the detection circuits according to the above embodiments and variations. The detection circuit can have an antenna which receives wireless signals instead of detectors which execute photoelectric conversion. The configuration and the feature of the sampler circuit 12 is the same as the sampler circuit according to the sixth embodiment. Depending on the process executed by the electronic apparatus 1b, the sampler circuit 12 can be omitted.

The computation circuit 15 executes calculations based on the electric signals entered from the detection circuit 11 or the sampler circuit 12. For example, the computation circuit 15 may count the number of photons detected during a certain period. The computation circuit 15 may demodulate or decode electric signals transmitted by electromagnetic waves. Also, the computation circuit 15 may generate images and videos based on the entered electric signals. Thus, the process executed by the computation circuit 15 is not limited.

The controller 16 controls each component of the electronic apparatus 1b. For example, the controller 16 changes the operation modes and settings of the detection circuit 11. Also, the controller 16 may turn on and turn off the detection circuit 11. The controller 16 may change the process executed by the computation circuit 15 or the operation modes of the computation circuit 15. The above processes are only examples. Thus, the controller 16 can execute any other process.

Eighth Embodiment

Figure 23:
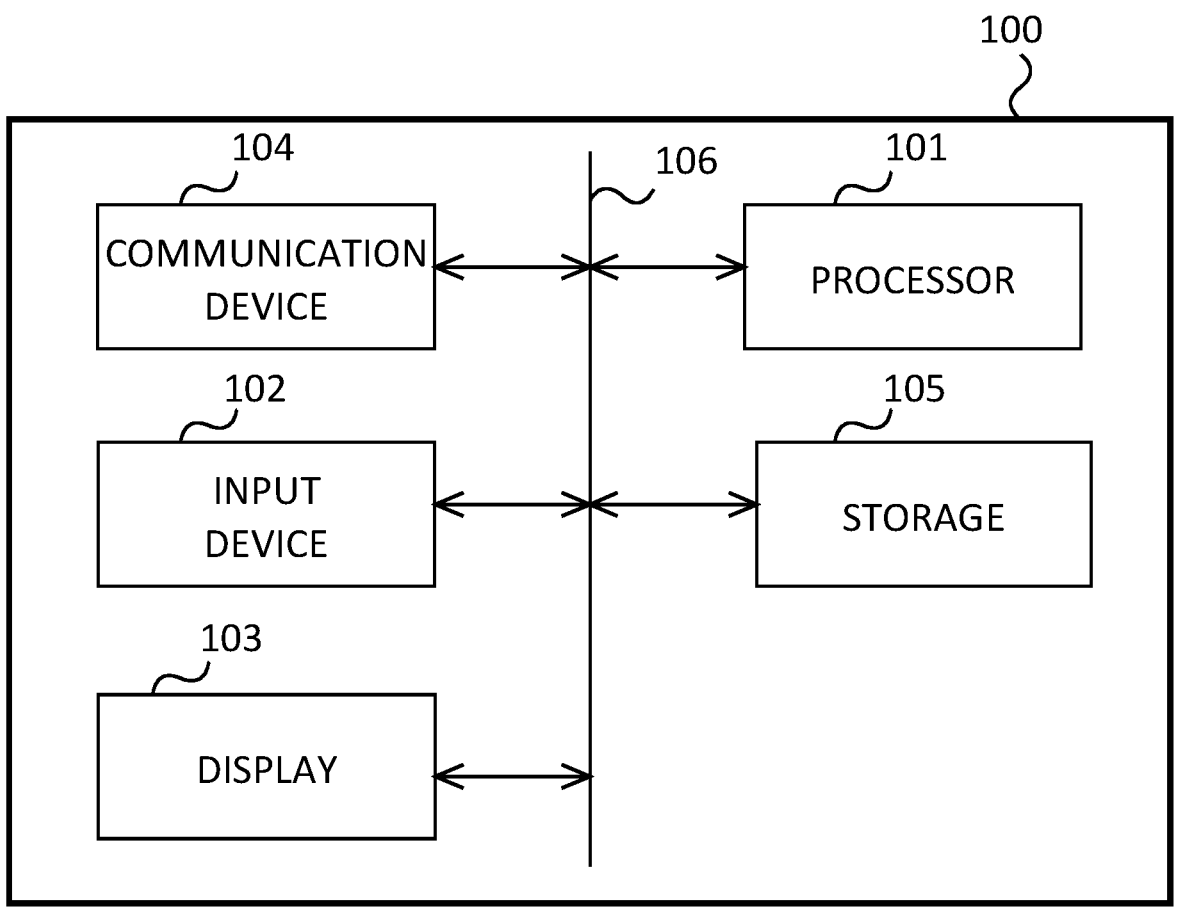
FIG. 23 is a block diagram describing a hardware configuration example of the electronic apparatus.

In the eighth embodiment, the hardware configuration of the components is described. FIG. 23 is a diagram showing hardware configuration of the electronic apparatus. For example, at least part of the processing circuit 13 according to the above embodiments and variations can be implemented by using a computer 100. The computer 100 can send instructions to the light source 10 to generate pulses. Also, the computer 100 can obtain results from the computation circuit 15 of the electronic apparatus 1 and display the results on a display 103.

Examples of the computer 100 include various information processing devices including servers, client devices, microprocessors of embedded devices, tablets, smartphones, feature phones and personal computers. The computer 100 may be implemented by VMs (virtual machines) or containers.

The computer 100 in FIG. 23 includes a processor 101, an input device 102, a display 103, a communication device 104 and a storage 105. The processor 101, the input device 102, the display 103, the communication device 104 and the storage 105 are electrically connected to each other via a bus 106.

The processor 101 is an electric circuit including the controller and arithmetic unit of the computer 100. It is possible to use general purpose processors, central processing units (CPUs), microprocessors, digital signal processors, controllers, microcontrollers, state-machines, ASICs, FPGAs, PLDs or a combination of the above as the processor 101.

The processor 101 executes arithmetic operations by using data or programs provided from devices connected via the bus 106 (for example, the input device 102, the communication device 104 and the storage 105). Also, the processor 101 transmits the calculated results and control signals to the devices connected via the bus 106 (for example, the display 103, the communication device 104 and the storage 105). Specifically, the processor 101 executes the OS (the operation system) of the computer 100 and control programs. Also, the processor 101 controls various devices which are included in the computer 100. The processor 101 may control devices which are communicating with the computer 100.

By using the control program, it is possible to make the computer 100 operate as the aforementioned electronic apparatus 1. Examples of processes executed by the control program include sending instructions to the pulse generator circuit of the light source 10, equalization of electric signals, notifying the settings of the emitted electromagnetic waves to the detection circuit 11 or the equalizer 14, calculations of distances in the computation circuit 15, calculations of detected photons in the computation circuit 15, demodulation of signals, decoding of signals and generation of images. At least part of the processes above can be executed by hardware circuits, instead of the control program.

The control program is stored in a non-transitory storage medium which is readable by the computer. Examples of the storage medium include optical discs, magnetic discs, magnetic tapes, flash memories and semiconductor memory. However, the type of storage medium is not limited. When the processor 101 executes the control program, the computer 100 operates as the electronic apparatus 1.

The input device 102 is a device for entering information to the computer 100. Examples of the input device 102 include a keyboard, a mouse and a touch panel. However, the type of device is not limited. By using the input device 102, the user can enter the pulse shapes of the emitted electromagnetic wave, pulse width of the emitted electromagnetic wave, intensity of the emitted electromagnetic wave, the timing when the pulse of the electromagnetic wave is emitted, the frequency of the electromagnetic wave, methods used for equalizations and instructions to start measurement of distances and instructions to change the contents displayed on the display 103, to the computer 100.

The display 103 can display texts, graphics and videos. Examples of the display 103 include a LCD (liquid crystal display), CRT (cathode ray tube) or an organic electroluminescence display. However, the type of displays used is not limited. If the computer 100 is used as a distance measuring device information including the shape of the pulses, width of the pulses, intensity of the pulses, timing for emitting pulses, the frequency (pulse information) and the distance to the object 2 can be presented on the display 103.

The communication device 104 enables the computer 100 to communicate with external devices via wireless or wired communication mediums. Examples of the communication device 104 include Network Interface Cards, communication modules, hubs and routers. However, the type of device is not limited. Also, if the computer 100 is a server installed in data centers and machine rooms, the computer 100 may accept instructions transmitted from remote communication terminals and transmit contents to be displayed in remote communication terminals, via the communication device 104.

The storage 105 saves the operating system of the computer 100, the program, data necessary to execute the program and data generated by the program. The storage 105 includes the main storage device and the external storage device. Examples of the main storage device include RAM, DRAM and SRAM. However, the type of device used as the main storage device is not limited. Also, examples of the external storage device include HDD, optical discs, flash memory and magnetic tapes. However, the type of device used as the external storage is not limited.

The computer 100 may include a plurality of processors 101, input devices 102, displays 103, communication devices 104 and storage 105. The computer 100 may be connected to peripheral devices such as printers or scanners.

The electronic apparatus 1 may include a single computer 100. The electronic apparatus 1 may include a plurality of computers which are communicable to with other computers.

The program may be stored in the storage 105 of the computer 100. The program may be stored in the external storage. The program may be uploaded to the Internet. By installing the program to the computer 100, the features of the electronic apparatus 1 become executable.

The terms used in the embodiments should be interpreted broadly. For example, the term "processor" may include a general-purpose processor, a central processor (CPU), a microprocessor, a digital signal processor (DSP), a controller, a micro-controller, and a state machine. Depending on situations, the "processor" may indicate an application specific integrated circuit, a field programmable gate array (FPGA), a programmable logic circuit (PLD), and the like. The "processor" may indicate a combination of processing devices such as a plurality of microprocessors, a combination of a DSP and a microprocessor, and one or more microprocessors cooperating with a DSP core.

As another example, the term "memory" may include any electronic component capable of storing electronic information. The "memory" can indicate a random access memory (RAM), a read only memory (ROM), a programmable read only memory (PROM), an erasable programmable read only memory (EPROM), an electrically erasable PROM (EEPROM), a nonvolatile random access memory (NVRAM), a flash memory, and a magnetic or optical data storage. The data saved in the devices mentioned above can be read by a processor. If the processor performs reads, writes or both reads and writes to the memory, the memory can be considered to be communicating electrically with the processor. The memory can be integrated with the processor. In such cases as well, the memory can be considered as communicating electrically with the processor.

The term "storage device" or "storage" may include any device that can store data using magnetic technology, optical technology, or nonvolatile memory. For example, the storage can be a HDD, an optical disk, a SSD, or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An electronic apparatus comprising:
a first avalanche photo diode;
a second avalanche photo diode;
a first pulse circuit configured to shape a signal of the first avalanche photo diode to a first pulse;
a second pulse circuit configured to shape a signal of the second avalanche photo diode to a second pulse;
a first waveform shaping circuit configured to shape the first pulse to a third pulse having a narrower frequency bandwidth than that of the first pulse;
a second waveform shaping circuit configured to shape the second pulse to a fourth pulse having a narrower frequency bandwidth than that of the second pulse; and
an adder configured to add the third pulse and the fourth pulse.

2. The electronic apparatus according to claim 1, further comprising:
a demultiplexer circuit configured to assign each of the first pulses and the second pulses to a plurality of channels and output the each of the first pulses and the second pulses to the assigned channel after a delay time, wherein
the first waveform circuit is connected to either of the channels, and the second waveform circuit is connected to either of the channels.

3. The electronic apparatus according to claim 2, further comprising:

an counter circuit configured to update a value of a counter when the first pulse or the second pulse is detected;
a delaying element configured to output the first pulse or the second pulse after the delay time; and
an output circuit configured to output the first pulse or the second pulse entered by the delaying element to the channel corresponding to the value of the counter.

4. The electronic apparatus according to claim 3 wherein the first pulse shaped by the first pulse circuit and the second pulse circuit shaped by the second pulse circuit are approximately rectangular shaped.

5. The electronic apparatus according to claim 1, further comprising:
a light source configured to emit a fifth pulse, wherein
the first avalanche photo diode and the second avalanche photo diode are configured to detect reflected waves of the fifth pulse; the first pulse circuit is configured to generate the first pulse with a pulse width equal to the pulse width of the fifth pulse; and the second pulse circuit is configured to generate the second pulse with a pulse width equal to the pulse width of the fifth pulse.

6. The electronic apparatus according to claim 1, wherein the third pulse shaped by the first waveform shaping circuit and the fourth pulse shaped by the second waveform circuit has shapes similar to either approximately triangular shapes, sinc function shapes or Gaussian function shapes.

7. The electronic apparatus according to claim 1, wherein the first waveform shaping circuit is configured to generate the third pulses by combining a plurality of the first pulses in time domain and amplitude direction; and the second waveform shaping circuit is configured to generate the fourth pulses by combining a plurality of the second pulses in time domain and amplitude direction.

8. The electronic apparatus according to claim 1, wherein the first waveform shaping circuit and the second waveform circuit includes a filter circuit.

9. The electronic apparatus according to claim 1, wherein the first waveform shaping circuit include a first pulse width adjusting circuit configured to adjust pulse width of the first pulse; and the second waveform shaping circuit include a second pulse width adjusting circuit configured to adjust pulse width of the second pulse.

10. The electronic apparatus according to claim 1, wherein
the first waveform shaping circuit and the second waveform circuit each include a plurality of delaying elements and a plurality of switches configured to operate based on the voltage of electric signal entered from each of the delaying element.

11. The electronic apparatus according to claim 1, wherein
the first avalanche photo diode and the second avalanche photo diode are configured to operate in Geiger mode.

* * * * *